(12) United States Patent
Bouazizi et al.

(10) Patent No.: US 11,388,427 B2
(45) Date of Patent: Jul. 12, 2022

(54) MULTIPLE DECODER INTERFACE FOR STREAMED MEDIA DATA

(71) Applicant: QUALCOMM Incorporated, San Diego, CA (US)

(72) Inventors: Imed Bouazizi, Frisco, TX (US); Thomas Stockhammer, Bergen (DE)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 17/143,633

(22) Filed: Jan. 7, 2021

(65) Prior Publication Data

US 2021/0218976 A1 Jul. 15, 2021

Related U.S. Application Data

(60) Provisional application No. 62/959,064, filed on Jan. 9, 2020.

(51) Int. Cl.
*H04N 19/00* (2014.01)
*H04N 19/44* (2014.01)
*H04N 19/85* (2014.01)

(52) U.S. Cl.
CPC ............. *H04N 19/44* (2014.11); *H04N 19/85* (2014.11)

(58) Field of Classification Search
CPC .. H04N 21/23439; H04N 19/85; H04N 19/44; H04N 21/4382; H04N 21/42607; H04N 21/4431; H03M 7/6023; H03M 7/6005
See application file for complete search history.

(56) References Cited

U.S. PATENT DOCUMENTS

| 2017/0041364 | A1* | 2/2017 | Trani | H04L 65/607 |
| 2017/0118540 | A1* | 4/2017 | Thomas | H04N 19/167 |
| 2017/0346873 | A1* | 11/2017 | Denoual | H04N 21/85406 |
| 2020/0053392 | A1* | 2/2020 | Hannuksela | H04N 19/46 |
| 2020/0381022 | A1* | 12/2020 | Ilola | H04N 19/597 |
| 2021/0092375 | A1* | 3/2021 | Choi | H04N 19/136 |

OTHER PUBLICATIONS

Bouazizi I., et al., "Decoder Interface Extensions", 129. MPEG Meeting; Jan. 13, 2010-Jan. 17, 2020; Brussels; (ISO/IEC JTC1/SC29/WG11 MPEG2020/m52465), No. m52465, Jan. 13, 2020 (Jan. 13, 2020), 6 Pages, XP030225120, Retrieved from the Internet: URL: http://phenix.int-evry.fr/mpeg/doc_end_user/documents/129_Brussels/wg11/m52465-v1-m52465_decoder_interface.zip [retrieved on Mar. 3, 2021] the whole document.

(Continued)

*Primary Examiner* — Zhihan Zhou
(74) *Attorney, Agent, or Firm* — Shumaker & Sieffert, P.A.

(57) ABSTRACT

An example device for decoding media data includes a memory configured to store the media data and one or more processors implemented in circuitry and communicatively coupled to the memory. The one or more processors are configured to determine whether two or more decoder instances are intended to be synchronized. The one or more processors are configured to, based on the two or more decoder instances being intended to be synchronized, control the two or more decoder instances so as to enable rendering of decoded data from each of the two or more decoder instances at a same presentation time.

30 Claims, 10 Drawing Sheets

(56) References Cited

OTHER PUBLICATIONS

International Search Report and Written Opinion—PCT/US2021/012682—ISA/EPO—dated Mar. 15, 2021.
Stockhammer T., "Multi-Decoder Interface: Concepts and Requirements", 125. MPEG Meeting; Jan. 14, 2019-Jan. 18, 2019; Marrakech; (ISO/IEC JTC1/SC29/WG11 MPEG2019/M46174), No. m46174, Jan. 14, 2019 (Jan. 14, 2019), 9 Pages, XP030214706, Retrieved from the Internet: URL: http://phenix.int-evry.fr/mpeg/doc_end_user/documents/125_Marrakech/wg11/m46174-v1-Multi-Decoder-lnterface.zip [retrieved on Mar. 3, 2021] pp. 5-8.
Thomas E., "Considerations of Working Draft on Video Decoding Interfaces for Immersive Media", 129. MPEG Meeting; Jan. 13, 2020-Jan. 17, 2020; Brussels; (ISO/IEC JTC1/SC29/WG11 Nxxxx), No. m52862, Jan. 13, 2020 (Jan. 13, 2020), 21 Pages, XP030225434, Retrieved from the Internet: URL: http://phenix.int-evry.fr/mpeg/doc_end_user/documents/129_Brussels/wg11/m52862-v1.
Thomas E., et al., "Considerations of Working Draft on Video Decoding Interfaces for Immersive Media", 128. MPEG Meeting; Oct. 7, 2019-Oct. 11, 2019; Geneva; (ISO/IEC JTC1/SC29/WG11 Nxxxx), No. m51488, Oct. 7, 2019 (Oct. 7, 2019), 17 Pages, XP030221805, Retrieved from the Internet: URL: http://phenix.int-evry.fr/mpeg/doc_end_user/documents/128_Geneva/wg11/m51488-v1-m51488.zip [retrieved on Mar. 3, 2021] the whole document.
Thomas E., et al., "Immersive Media Delivery and Access", 125. MPEG Meeting; Jan. 14, 2019-Jan. 18, 2019; MARRAKECH; (ISO/IEC JTC1/SC29/WG11 N18134), No. m47569, Jan. 1, 2019 (Jan. 1, 2019), 18 Pages, XP030211641, Retrieved from the Internet: URL: http://phenix.int-evry.fr/mpeg/doc_end_user/documents/126_Geneva/wg1 1/m47569-v1-MDI.zip [retrieved on Mar. 25, 2019] the whole document.
Fielding R., et al., "Hypertext Transfer Protocol—HTTP/1.1", Network Working Group, Request for Comments, RFC 2616, Standards Track, Jun. 1999, pp. 1-114.
ITU-T H.265, Series H: Audiovisual and Multimedia Systems, Infrastructure of Audiovisual Services—Coding of Moving Video, High Efficiency Video Coding, The International Telecommunication Union, Jun. 2019, 696 Pages.
Paila T., et al., "FLUTE—File Delivery Over Unidirectional Transport", FLUTE—File Delivery over Unidirectional Transport, rfc6726.txt, Internet Engineering Task Force (IETF), Standard Track, Internet Society (ISOC) 4, Rue Des Falaises CH-1205 Geneva, Switzerland, Nov. 6, 2012 (Nov. 6, 2012), XP015086468, pp. 1-46, http://tools.ietf.org/html/rfc6726, [retrieved on Nov. 6, 2012], p. 3, line 30-p. 27, line 12.
Systems Subgroup: "Considerations of Working Draft on Video Decoding Interfaces for Immersive Media", ISO/IEC JTC 1/SC 29/WG 11, N18868, Geneva, CH, Oct. 2019, 19 pages [Oct. 11, 2019].
Systems Subgroup: "WD on Video Decoding Interface for Immersive Media", ISO/IEC JTC 1/SC 29/WG 11, N19443, Jun. 2020, 25 pages, http://isotc.iso.org/livelink/livelink/open/jtc1sc29 [Jul. 12, 2020].

* cited by examiner

MULTIPLE DECODER INTERFACE FOR STREAMED MEDIA DATA

This application claims the benefit of U.S. Provisional Application No. 62/959,064 filed Jan. 9, 2020, the entire content of which is hereby incorporated by reference.

TECHNICAL FIELD

This disclosure relates to decoding of media data.

BACKGROUND

Digital video capabilities can be incorporated into a wide range of devices, including digital televisions, digital direct broadcast systems, wireless broadcast systems, personal digital assistants (PDAs), laptop or desktop computers, digital cameras, digital recording devices, digital media players, video gaming devices, video game consoles, cellular or satellite radio telephones, video teleconferencing devices, and the like. Digital video devices implement video compression techniques, such as those described in the standards defined by MPEG-2, MPEG-4, ITU-T H.263 or ITU-T H.264/MPEG-4, Part 10, Advanced Video Coding (AVC), ITU-T H.265 (also referred to as High Efficiency Video Coding (HEVC)), and extensions of such standards, to transmit and receive digital video information more efficiently.

After media data, such as audio and video data, has been encoded, the media data may be packetized for transmission or storage. The media data may be assembled into a media file conforming to any of a variety of standards, such as the International Organization for Standardization (ISO) base media file format and extensions thereof, such as AVC.

SUMMARY

In general, this disclosure describes techniques for decoding media data of different types by different respective decoders at a client device. Recently, a set of issues was identified with various application programming interfaces (APIs) when handling immersive data. The techniques of the present disclosure may address the identified issues.

In one example, a method of decoding media data includes determining, by a client device, whether two or more decoder instances are intended to be synchronized and based on the two or more decoder instances being intended to be synchronized, controlling the two or more decoder instances so as to enable rendering of decoded data from each of the two or more decoder instances at a same presentation time.

In another example, a device for decoding media data includes memory configured to store the media data, and one or more processors implemented in circuitry and communicatively coupled to the memory, the one or more processors being configured to: determine whether two or more decoder instances are intended to be synchronized; and based on the two or more decoder instances being intended to be synchronized, control the two or more decoder instances so as to enable rendering of decoded data from each of the two or more decoder instances at a same presentation time.

In another example, a non-transitory computer-readable storage medium stores instructions, which, when executed by one or more processors, cause the one or more processors to: determine whether two or more decoder instances are intended to be synchronized; and based on the two or more decoder instances being intended to be synchronized, control the two or more decoder instances so as to enable rendering of decoded data from each of the two or more decoder instances at a same presentation time.

In another example, a device for decoding media data includes means for determining whether two or more decoder instances are intended to be synchronized, and means for controlling the two or more decoder instances so as to enable rendering of decoded data from each of the two or more decoder instances at a same presentation time based on the two or more decoder instances being intended to be synchronized.

The details of one or more examples are set forth in the accompanying drawings and the description below. Other features, objects, and advantages will be apparent from the description and drawings, and from the claims.

DETAILED DESCRIPTION

Figure 1:
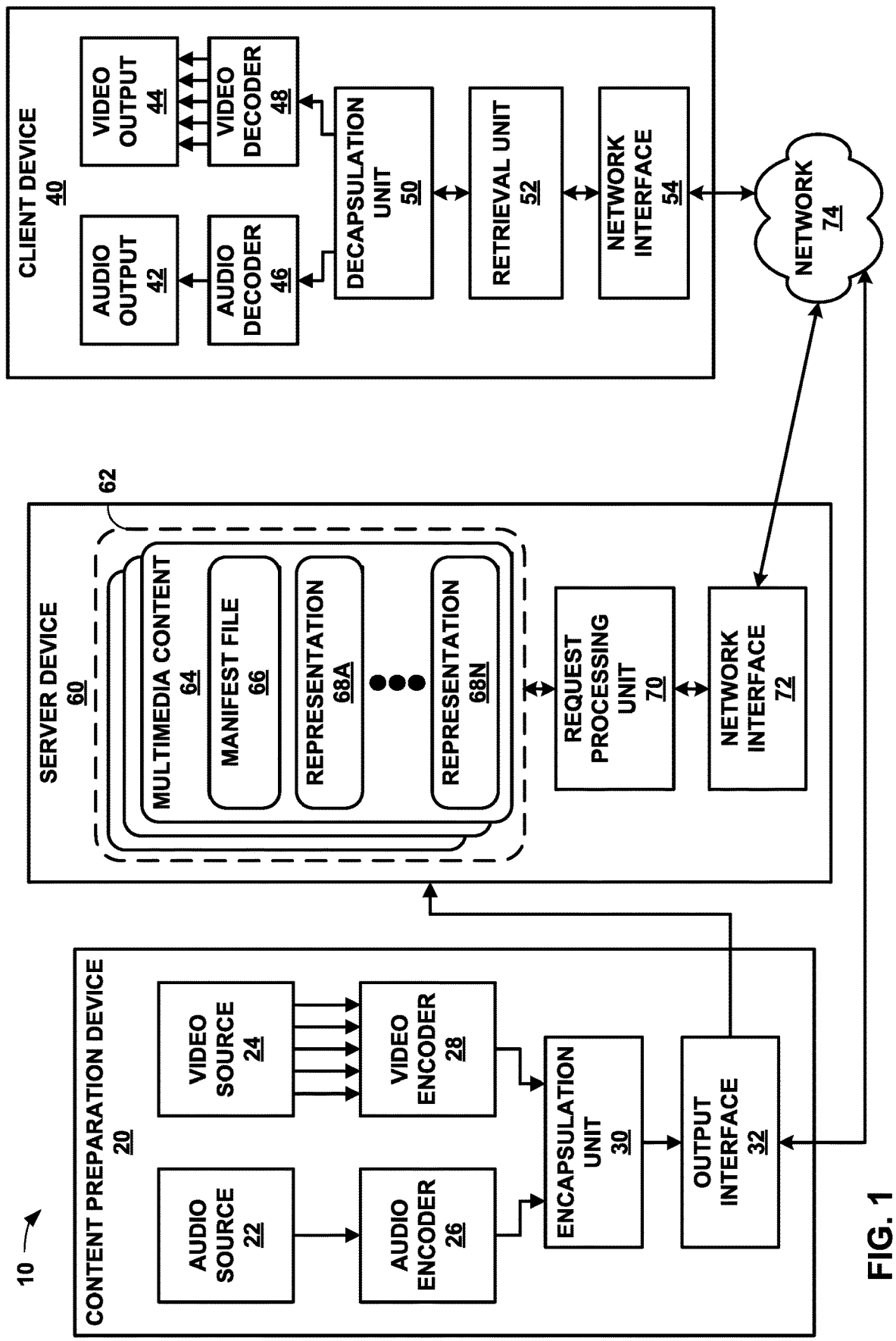
FIG. 1 is a block diagram illustrating an example system that implements techniques for streaming media data over a network.

In some media applications, media scenes are composed of multiple videos. Such videos may be postprocessed and then rendered jointly. For example, they may be stitched, overlaid, or a scene composition creates an immersive experience. This disclosure describes techniques that may be applied to bitstreams including immersive media data (e.g., audio and video data).

In some examples, multiple video decoders (MVDs) provide access to the decoding hardware through APIs like OpenMAX IL or Android's MediaCodec APIs. These APIs enable MVDs to create and run multiple decoder instances, even in cases where there is a single hardware decoder.

However, these APIs may lack some capabilities for the handling of immersive media. For example, the APIs may lack the ability to discover the aggregate processing capability of the MVDs. For example, logical grouping of multiple samples from different streams for simultaneous decoding may not be possible. In some examples, the aggregation may be inferred from an nTimestamp parameter in a buffer header, but there is no information to the MVD component to keep the delay skew to a minimum when decoding these related samples. Additionally, fine granular control of the scheduling of the different decoder instances may not be possible.

According to the techniques of this disclosure, abstract extensions to the decoder APIs may provide better support for immersive media and address the issues discussed above. These abstract extensions may be mapped to OpenMAX IL and MediaCodec, for example.

The techniques of this disclosure may be applied to video files conforming to video data encapsulated according to any of ISO base media file format, Scalable Video Coding (SVC) file format, Advanced Video Coding (AVC) file format, Third Generation Partnership Project (3GPP) file format, and/or Multiview Video Coding (MVC) file format, or other similar video file formats.

In HTTP streaming, frequently used operations include HEAD, GET, and partial GET. The HEAD operation retrieves a header of a file associated with a given uniform resource locator (URL) or uniform resource name (URN), without retrieving a payload associated with the URL or URN. The GET operation retrieves a whole file associated with a given URL or URN. The partial GET operation receives a byte range as an input parameter and retrieves a continuous number of bytes of a file, where the number of bytes corresponds to the received byte range. Thus, movie fragments may be provided for HTTP streaming, because a partial GET operation can get one or more individual movie fragments. In a movie fragment, there can be several track fragments of different tracks. In HTTP streaming, a media presentation may be a structured collection of data that is accessible to the client. The client may request and download media data information to present a streaming service to a user.

In the example of streaming 3GPP data using HTTP streaming, there may be multiple representations for video and/or audio data of multimedia content. As explained below, different representations may correspond to different coding characteristics (e.g., different profiles or levels of a video coding standard), different coding standards or extensions of coding standards (such as multiview and/or scalable extensions), or different bitrates. The manifest of such representations may be defined in a Media Presentation Description (MPD) data structure. A media presentation may correspond to a structured collection of data that is accessible to an HTTP streaming client device. The HTTP streaming client device may request and download media data information to present a streaming service to a user of the client device. A media presentation may be described in the MPD data structure, which may include updates of the MPD.

A media presentation may contain a sequence of one or more periods. Each period may extend until the start of the next period, or until the end of the media presentation, in the case of the last period. Each period may contain one or more representations for the same media content. A representation may be one of a number of alternative encoded versions of audio, video, timed text, or other such data. The representations may differ by encoding types, e.g., by bitrate, resolution, and/or codec for video data and bitrate, language, and/or codec for audio data. The term representation may be used to refer to a section of encoded audio or video data corresponding to a particular period of the multimedia content and encoded in a particular way.

Representations of a particular period may be assigned to a group indicated by an attribute in the MPD indicative of an adaptation set to which the representations belong. Representations in the same adaptation set are generally considered alternatives to each other, in that a client device can dynamically and seamlessly switch between these representations, e.g., to perform bandwidth adaptation. For example, each representation of video data for a particular period may be assigned to the same adaptation set, such that any of the representations may be selected for decoding to present media data, such as video data or audio data, of the multimedia content for the corresponding period. The media content within one period may be represented by either one representation from group 0, if present, or the combination of at most one representation from each non-zero group, in some examples. Timing data for each representation of a period may be expressed relative to the start time of the period.

A representation may include one or more segments. Each representation may include an initialization segment, or each segment of a representation may be self-initializing. When present, the initialization segment may contain initialization information for accessing the representation. In general, the initialization segment does not contain media data. A segment may be uniquely referenced by an identifier, such as a uniform resource locator (URL), uniform resource name (URN), or uniform resource identifier (URI). The MPD may provide the identifiers for each segment. In some examples, the MPD may also provide byte ranges in the form of a range attribute, which may correspond to the data for a segment within a file accessible by the URL, URN, or URI.

Different representations may be selected for substantially simultaneous retrieval for different types of media data. For example, a client device may select an audio representation, a video representation, and a timed text representation from which to retrieve segments. In some examples, the client device may select particular adaptation sets for performing bandwidth adaptation. That is, the client device may select an adaptation set including video representations, an adaptation set including audio representations, and/or an adaptation set including timed text. Alternatively, the client device may select adaptation sets for certain types of media (e.g., video), and directly select representations for other types of media (e.g., audio and/or timed text).

FIG. 1 is a block diagram illustrating an example system 10 that implements techniques for streaming media data over a network. In this example, system 10 includes content preparation device 20, server device 60, and client device 40. Client device 40 and server device 60 are communicatively coupled by network 74, which may comprise the Internet. In some examples, content preparation device 20 and server device 60 may also be coupled by network 74 or another network, or may be directly communicatively coupled. In some examples, content preparation device 20 and server device 60 may comprise the same device.

Content preparation device 20, in the example of FIG. 1, comprises audio source 22 and video source 24. Audio source 22 may comprise, for example, a microphone that produces electrical signals representative of captured audio data to be encoded by audio encoder 26. Alternatively, audio source 22 may comprise a storage medium storing previously recorded audio data, an audio data generator such as a computerized synthesizer, or any other source of audio data. Video source 24 may comprise a video camera that produces video data to be encoded by video encoder 28, a storage medium encoded with previously recorded video data, a video data generation unit such as a computer graphics source, or any other source of video data. Content preparation device 20 is not necessarily communicatively coupled to server device 60 in all examples, but may store multimedia content to a separate medium that is read by server device 60.

Raw audio and video data may comprise analog or digital data. Analog data may be digitized before being encoded by audio encoder 26 and/or video encoder 28. Audio source 22 may obtain audio data from a speaking participant while the speaking participant is speaking, and video source 24 may simultaneously obtain video data of the speaking participant. In other examples, audio source 22 may comprise a computer-readable storage medium comprising stored audio data, and video source 24 may comprise a computer-readable storage medium comprising stored video data. In this manner, the techniques described in this disclosure may be applied to live, streaming, real-time audio and video data or to archived, pre-recorded audio and video data.

Audio frames that correspond to video frames are generally audio frames containing audio data that was captured (or generated) by audio source 22 contemporaneously with video data captured (or generated) by video source 24 that is contained within the video frames. For example, while a speaking participant generally produces audio data by speaking, audio source 22 captures the audio data, and video source 24 captures video data of the speaking participant at the same time, that is, while audio source 22 is capturing the audio data. Hence, an audio frame may temporally correspond to one or more particular video frames. Accordingly, an audio frame corresponding to a video frame generally corresponds to a situation in which audio data and video data were captured at the same time and for which an audio frame and a video frame comprise, respectively, the audio data and the video data that was captured at the same time.

In some examples, audio encoder 26 may encode a timestamp in each encoded audio frame that represents a time at which the audio data for the encoded audio frame was recorded, and similarly, video encoder 28 may encode a timestamp in each encoded video frame that represents a time at which the video data for an encoded video frame was recorded. In such examples, an audio frame corresponding to a video frame may comprise an audio frame comprising a timestamp and a video frame comprising the same timestamp. Content preparation device 20 may include an internal clock from which audio encoder 26 and/or video encoder 28 may generate the timestamps, or that audio source 22 and video source 24 may use to associate audio and video data, respectively, with a timestamp.

In some examples, audio source 22 may send data to audio encoder 26 corresponding to a time at which audio data was recorded, and video source 24 may send data to video encoder 28 corresponding to a time at which video data was recorded. In some examples, audio encoder 26 may encode a sequence identifier in encoded audio data to indicate a relative temporal ordering of encoded audio data but without necessarily indicating an absolute time at which the audio data was recorded, and similarly, video encoder 28 may also use sequence identifiers to indicate a relative temporal ordering of encoded video data. Similarly, in some examples, a sequence identifier may be mapped or otherwise correlated with a timestamp.

Audio encoder 26 generally produces a stream of encoded audio data, while video encoder 28 produces a stream of encoded video data. Each individual stream of data (whether audio or video) may be referred to as an elementary stream. An elementary stream is a single, digitally coded (possibly compressed) component of a representation. For example, the coded video or audio part of the representation can be an elementary stream. An elementary stream may be converted into a packetized elementary stream (PES) before being encapsulated within a video file. Within the same representation, a stream ID may be used to distinguish the PES-packets belonging to one elementary stream from the other. The basic unit of data of an elementary stream is a packetized elementary stream (PES) packet. Thus, coded video data generally corresponds to elementary video streams. Similarly, audio data corresponds to one or more respective elementary streams.

Many video coding standards, such as ITU-T H.264/AVC and the upcoming High Efficiency Video Coding (HEVC) standard, define the syntax, semantics, and decoding process for error-free bitstreams, any of which conform to a certain profile or level. Video coding standards typically do not specify the encoder, but the encoder is tasked with guaranteeing that the generated bitstreams are standard-compliant for a decoder. In the context of video coding standards, a "profile" corresponds to a subset of algorithms, features, or tools and constraints that apply to them. As defined by the H.264 standard, for example, a "profile" is a subset of the entire bitstream syntax that is specified by the H.264 standard. A "level" corresponds to the limitations of the decoder resource consumption, such as, for example, decoder memory and computation, which are related to the resolution of the pictures, bit rate, and block processing rate. A profile may be signaled with a profile_idc (profile indicator) value, while a level may be signaled with a level_idc (level indicator) value.

The H.264 standard, for example, recognizes that, within the bounds imposed by the syntax of a given profile, it is still possible to require a large variation in the performance of encoders and decoders depending upon the values taken by syntax elements in the bitstream such as the specified size of the decoded pictures. The H.264 standard further recognizes that, in many applications, it is neither practical nor economical to implement a decoder capable of dealing with all hypothetical uses of the syntax within a particular profile. Accordingly, the H.264 standard defines a "level" as a specified set of constraints imposed on values of the syntax elements in the bitstream. These constraints may be simple limits on values. Alternatively, these constraints may take the form of constraints on arithmetic combinations of values (e.g., picture width multiplied by picture height multiplied by number of pictures decoded per second). The H.264 standard further provides that individual implementations may support a different level for each supported profile.

A decoder conforming to a profile ordinarily supports all the features defined in the profile. For example, as a coding feature, B-picture coding is not supported in the baseline profile of H.264/AVC but is supported in other profiles of H.264/AVC. A decoder conforming to a level should be capable of decoding any bitstream that does not require resources beyond the limitations defined in the level. Definitions of profiles and levels may be helpful for interpretability. For example, during video transmission, a pair of profile and level definitions may be negotiated and agreed for a whole transmission session. More specifically, in H.264/AVC, a level may define limitations on the number of macroblocks that need to be processed, decoded picture buffer (DPB) size, coded picture buffer (CPB) size, vertical motion vector range, maximum number of motion vectors per two consecutive MBs, and whether a B-block can have sub-macroblock partitions less than 8×8 pixels. In this manner, a decoder may determine whether the decoder is capable of properly decoding the bitstream.

In the example of FIG. 1, encapsulation unit 30 of content preparation device 20 receives elementary streams comprising coded video data from video encoder 28 and elementary streams comprising coded audio data from audio encoder 26. In some examples, video encoder 28 and audio encoder 26 may each include packetizers for forming packetized elementary system (PES) packets from encoded data. In other examples, video encoder 28 and audio encoder 26 may each interface with respective packetizers for forming PES packets from encoded data. In still other examples, encapsulation unit 30 may include packetizers for forming PES packets from encoded audio and video data.

Video encoder 28 may encode video data of multimedia content in a variety of ways, to produce different representations of the multimedia content at various bitrates and with various characteristics, such as pixel resolutions, frame rates, conformance to various coding standards, conformance to various profiles and/or levels of profiles for various coding standards, representations having one or multiple views (e.g., for two-dimensional or three-dimensional playback), or other such characteristics. A representation, as used in this disclosure, may comprise one of audio data, video data, text data (e.g., for closed captions), or other such data. The representation may include an elementary stream, such as an audio elementary stream or a video elementary stream. Each PES packet may include a stream id that identifies the elementary stream to which the PES packet belongs. Encapsulation unit 30 is responsible for assembling elementary streams into video files (e.g., segments) of various representations.

Encapsulation unit 30 receives PES packets for elementary streams of a representation from audio encoder 26 and video encoder 28 and forms corresponding network abstraction layer (NAL) units from the PES packets. Coded video segments may be organized into NAL units, which provide a "network-friendly" video representation addressing applications such as video telephony, storage, broadcast, or streaming. NAL units can be categorized to Video Coding Layer (VCL) NAL units and non-VCL NAL units. VCL units may contain the core compression engine and may include block, macroblock, and/or slice level data. Other NAL units may be non-VCL NAL units. In some examples, a coded picture in one time instance, normally presented as a primary coded picture, may be contained in an access unit, which may include one or more NAL units.

Non-VCL NAL units may include parameter set NAL units and Supplemental Enhancement Information (SEI) NAL units, among others. Parameter sets may contain sequence-level header information (in sequence parameter sets (SPS)) and the infrequently changing picture-level header information (in picture parameter sets (PPS)). With parameter sets (e.g., PPS and SPS), infrequently changing information need not to be repeated for each sequence or picture; hence, coding efficiency may be improved. Furthermore, the use of parameter sets may enable out-of-band transmission of the important header information, avoiding the need for redundant transmissions for error resilience. In out-of-band transmission examples, parameter set NAL units may be transmitted on a different channel than other NAL units, such as SEI NAL units.

SEI may contain information that is not necessary for decoding the coded pictures samples from VCL NAL units, but may assist in processes related to decoding, display, error resilience, and other purposes. SEI messages may be contained in non-VCL NAL units. SEI messages are the normative part of some standard specifications, and thus are not always mandatory for standard compliant decoder implementation. SEI messages may be sequence level SEI messages or picture level SEI messages. Some sequence level information may be contained in SEI messages, such as scalability information SEI messages in the example of SVC and view scalability information SEI messages in MVC. These example SEI messages may convey information on, e.g., extraction of operation points and characteristics of the operation points. In addition, encapsulation unit 30 may form a manifest file, such as a media presentation descriptor (MPD) that describes characteristics of the representations. Encapsulation unit 30 may format the MPD according to extensible markup language (XML).

Encapsulation unit 30 may provide data for one or more representations of multimedia content, along with the manifest file (e.g., the MPD) to output interface 32. Output interface 32 may comprise a network interface or an interface for writing to a storage medium, such as a universal serial bus (USB) interface, a compact disc (CD) or digital video disc (DVD) writer or burner, an interface to magnetic or flash storage media, or other interfaces for storing or transmitting media data. Encapsulation unit 30 may provide data of each of the representations of multimedia content to output interface 32, which may send the data to server device 60 via network transmission or storage media. In the example of FIG. 1, server device 60 includes storage medium 62 that stores various multimedia contents 64, each including a respective manifest file 66 and one or more representations 68A-68N (representations 68). In some examples, output interface 32 may also send data directly to network 74.

In some examples, representations 68 may be separated into adaptation sets. That is, various subsets of representations 68 may include respective common sets of characteristics, such as codec, profile and level, resolution, number of views, file format for segments, text type information that may identify a language or other characteristics of text to be displayed with the representation and/or audio data to be decoded and presented, e.g., by speakers, camera angle information that may describe a camera angle or real-world camera perspective of a scene for representations in the adaptation set, rating information that describes content suitability for particular audiences, or the like.

Manifest file 66 may include data indicative of the subsets of representations 68 corresponding to particular adaptation sets, as well as common characteristics for the adaptation sets. Manifest file 66 may also include data representative of individual characteristics, such as bitrates, for individual representations of adaptation sets. In this manner, an adaptation set may provide for simplified network bandwidth adaptation. Representations in an adaptation set may be indicated using child elements of an adaptation set element of manifest file 66.

Server device 60 includes request processing unit 70 and network interface 72. In some examples, server device 60 may include a plurality of network interfaces. Furthermore, any or all of the features of server device 60 may be implemented on other devices of a content delivery network, such as routers, bridges, proxy devices, switches, or other devices. In some examples, intermediate devices of a content delivery network may cache data of multimedia content 64, and include components that conform substantially to those of server device 60. In general, network interface 72 is configured to send and receive data via network 74.

Request processing unit 70 is configured to receive network requests from client devices, such as client device 40, for data of storage medium 62. For example, request processing unit 70 may implement hypertext transfer protocol (HTTP) version 1.1, as described in RFC 2616, "Hypertext Transfer Protocol—HTTP/1.1," by R. Fielding et al, Network Working Group, IETF, June 1999. That is, request processing unit 70 may be configured to receive HTTP GET or partial GET requests and provide data of multimedia content 64 in response to the requests. The requests may specify a segment of one of representations 68, e.g., using a URL of the segment. In some examples, the requests may also specify one or more byte ranges of the segment, thus comprising partial GET requests. Request processing unit 70 may further be configured to service HTTP HEAD requests to provide header data of a segment of one of representations 68. In any case, request processing unit 70 may be configured to process the requests to provide requested data to a requesting device, such as client device 40.

Additionally or alternatively, request processing unit 70 may be configured to deliver media data via a broadcast or multicast protocol, such as evolved Multimedia Broadcast and Multicast Services (eMBMS). Content preparation device 20 may create Dynamic Adaptive Streaming over HTTP (DASH) segments and/or sub-segments in substantially the same way as described, but server device 60 may deliver these segments or sub-segments using eMBMS or another broadcast or multicast network transport protocol. For example, request processing unit 70 may be configured to receive a multicast group join request from client device 40. That is, server device 60 may advertise an Internet protocol (IP) address associated with a multicast group to client devices, including client device 40, associated with particular media content (e.g., a broadcast of a live event). Client device 40, in turn, may submit a request to join the multicast group. This request may be propagated throughout network 74, e.g., routers making up network 74, such that the routers are caused to direct traffic destined for the IP address associated with the multicast group to subscribing client devices, such as client device 40.

As illustrated in the example of FIG. 1, multimedia content 64 includes manifest file 66, which may correspond to a media presentation description (MPD). Manifest file 66 may contain descriptions of different alternative representations 68 (e.g., video services with different qualities) and the description may include, e.g., codec information, a profile value, a level value, a bitrate, and other descriptive characteristics of representations 68. Client device 40 may retrieve the MPD of a media presentation to determine how to access segments of representations 68.

In particular, retrieval unit 52 may retrieve configuration data (not shown) of client device 40 to determine decoding capabilities of video decoder 48 and rendering capabilities of video output 44. The configuration data may also include any or all of a language preference selected by a user of client device 40, one or more camera perspectives corresponding to depth preferences set by the user of client device 40, and/or a rating preference selected by the user of client device 40. Retrieval unit 52 may comprise, for example, a web browser or a media client configured to submit HTTP GET and partial GET requests. Retrieval unit 52 may correspond to software instructions executed by one or more processors or processing units (not shown) of client device 40. In some examples, all or portions of the functionality described with respect to retrieval unit 52 may be implemented in hardware, or a combination of hardware, software, and/or firmware, where requisite hardware may be provided to execute instructions for software or firmware.

Although only a single video decoder 48 is shown in the example of FIG. 1, as discussed in greater detail below (e.g., with respect to FIG. 8), client device 40 may be configured to include a plurality of video decoders. In addition, decapsulation unit 50 may be configured to include a demultiplexer that demultiplexes a plurality of encoded video bitstreams (e.g., for different tiles of cube mapped video data) and that directs the encoded video bitstreams to different video decoders. Decapsulation unit 50 may include an interface, such as an application programming interface (API) that directs video data of the various video bitstreams to corresponding video decoders. Additionally, client device 40 may include a synchronization unit that temporally synchronizes decoded video data (e.g., pictures) from the plurality of video decoders, as well as audio data decoded by audio decoder 46.

Retrieval unit 52 may compare the decoding and rendering capabilities of client device 40 to characteristics of representations 68 indicated by information of manifest file 66. Retrieval unit 52 may initially retrieve at least a portion of manifest file 66 to determine characteristics of representations 68. For example, retrieval unit 52 may request a portion of manifest file 66 that describes characteristics of one or more adaptation sets. Retrieval unit 52 may select a subset of representations 68 (e.g., an adaptation set) having characteristics that can be satisfied by the coding and rendering capabilities of client device 40. Retrieval unit 52 may then determine bitrates for representations in the adaptation set, determine a currently available amount of network bandwidth, and retrieve segments from one of the representations having a bitrate that can be satisfied by the network bandwidth.

In general, higher bitrate representations may yield higher quality video playback, while lower bitrate representations may provide sufficient quality video playback when available network bandwidth decreases. Accordingly, when available network bandwidth is relatively high, retrieval unit 52 may retrieve data from relatively high bitrate representations, whereas when available network bandwidth is low, retrieval unit 52 may retrieve data from relatively low bitrate representations. In this manner, client device 40 may stream multimedia data over network 74 while also adapting to changing network bandwidth availability of network 74.

Additionally or alternatively, retrieval unit 52 may be configured to receive data in accordance with a broadcast or multicast network protocol, such as eMBMS or IP multicast. In such examples, retrieval unit 52 may submit a request to join a multicast network group associated with particular media content. After joining the multicast group, retrieval unit 52 may receive data of the multicast group without further requests issued to server device 60 or content preparation device 20. Retrieval unit 52 may submit a request to leave the multicast group when data of the multicast group is no longer needed, e.g., to stop playback or to change channels to a different multicast group.

Network interface 54 may receive and provide data of segments of a selected representation to retrieval unit 52, which may in turn provide the segments to decapsulation unit 50. Decapsulation unit 50 may decapsulate elements of a video file into constituent PES streams, depacketize the PES streams to retrieve encoded data, and send the encoded data to either audio decoder 46 or video decoder 48, depending on whether the encoded data is part of an audio or video stream, e.g., as indicated by PES packet headers of the stream. Audio decoder 46 decodes encoded audio data and sends the decoded audio data to audio output 42, while video decoder 48 decodes encoded video data and sends the decoded video data, which may include a plurality of views of a stream, to video output 44.

Video encoder 28, video decoder 48, audio encoder 26, audio decoder 46, encapsulation unit 30, retrieval unit 52, and decapsulation unit 50 each may be implemented as any of a variety of suitable processing circuitry, as applicable, such as one or more microprocessors, digital signal processors (DSPs), application specific integrated circuits (ASICs), field programmable gate arrays (FPGAs), discrete logic circuitry, software, hardware, firmware or any combinations thereof. Each of video encoder 28 and video decoder 48 may be included in one or more encoders or decoders, either of which may be integrated as part of a combined video encoder/decoder (CODEC). Likewise, each of audio encoder 26 and audio decoder 46 may be included in one or more encoders or decoders, either of which may be integrated as part of a combined CODEC. An apparatus including video encoder 28, video decoder 48, audio encoder 26, audio decoder 46, encapsulation unit 30, retrieval unit 52, and/or decapsulation unit 50 may comprise an integrated circuit, a microprocessor, and/or a wireless communication device, such as a cellular telephone.

Client device 40, server device 60, and/or content preparation device 20 may be configured to operate in accordance with the techniques of this disclosure. For purposes of example, this disclosure describes these techniques with respect to client device 40 and server device 60. However, it should be understood that content preparation device 20 may be configured to perform these techniques, instead of (or in addition to) server device 60.

Encapsulation unit 30 may form NAL units comprising a header that identifies a program to which the NAL unit belongs, as well as a payload, e.g., audio data, video data, or data that describes the transport or program stream to which the NAL unit corresponds. For example, in H.264/AVC, a NAL unit includes a 1-byte header and a payload of varying size. A NAL unit including video data in its payload may comprise various granularity levels of video data. For example, a NAL unit may comprise a block of video data, a plurality of blocks, a slice of video data, or an entire picture of video data. Encapsulation unit 30 may receive encoded video data from video encoder 28 in the form of PES packets of elementary streams. Encapsulation unit 30 may associate each elementary stream with a corresponding program.

Encapsulation unit 30 may also assemble access units from a plurality of NAL units. In general, an access unit may comprise one or more NAL units for representing a frame of video data, as well as audio data corresponding to the frame when such audio data is available. An access unit generally includes all NAL units for one output time instance, e.g., all audio and video data for one time instance. For example, if each view has a frame rate of 20 frames per second (fps), then each time instance may correspond to a time interval of 0.05 seconds. During this time interval, the specific frames for all views of the same access unit (the same time instance) may be rendered simultaneously. In one example, an access unit may comprise a coded picture in one time instance, which may be presented as a primary coded picture.

Accordingly, an access unit may comprise all audio and video frames of a common temporal instance, e.g., all views corresponding to time X. This disclosure also refers to an encoded picture of a particular view as a "view component." That is, a view component may comprise an encoded picture (or frame) for a particular view at a particular time. Accordingly, an access unit may be defined as comprising all view components of a common temporal instance. The decoding order of access units need not necessarily be the same as the output or display order.

A media presentation may include a media presentation description (MPD), which may contain descriptions of different alternative representations (e.g., video services with different qualities) and the description may include, e.g., codec information, a profile value, and a level value. An MPD is one example of a manifest file, such as manifest file 66. Client device 40 may retrieve the MPD of a media presentation to determine how to access movie fragments of various presentations. Movie fragments may be located in movie fragment boxes (MOOF boxes) of video files.

Manifest file 66 (which may comprise, for example, an MPD) may advertise availability of segments of representations 68. That is, the MPD may include information indicating the wall-clock time at which a first segment of one of representations 68 becomes available, as well as information indicating the durations of segments within representations 68. In this manner, retrieval unit 52 of client device 40 may determine when each segment is available, based on the starting time as well as the durations of the segments preceding a particular segment.

After encapsulation unit 30 has assembled NAL units and/or access units into a video file based on received data, encapsulation unit 30 passes the video file to output interface 32 for output. In some examples, encapsulation unit 30 may store the video file locally or send the video file to a remote server via output interface 32, rather than sending the video file directly to client device 40. Output interface 32 may comprise, for example, a transmitter, a transceiver, a device for writing data to a computer-readable medium such as, for example, an optical drive, a magnetic media drive (e.g., floppy drive), a universal serial bus (USB) port, a network interface, or other output interface. Output interface 32 outputs the video file to a computer-readable medium, such as, for example, a transmission signal, a magnetic medium, an optical medium, a memory, a flash drive, or other computer-readable medium.

Network interface 54 may receive a NAL unit or access unit via network 74 and provide the NAL unit or access unit to decapsulation unit 50, via retrieval unit 52. Decapsulation unit 50 may decapsulate a elements of a video file into constituent PES streams, depacketize the PES streams to retrieve encoded data, and send the encoded data to either audio decoder 46 or video decoder 48, depending on whether the encoded data is part of an audio or video stream, e.g., as indicated by PES packet headers of the stream. Audio decoder 46 decodes encoded audio data and sends the decoded audio data to audio output 42, while video decoder 48 decodes encoded video data and sends the decoded video data, which may include a plurality of views of a stream, to video output 44.

Figure 2:
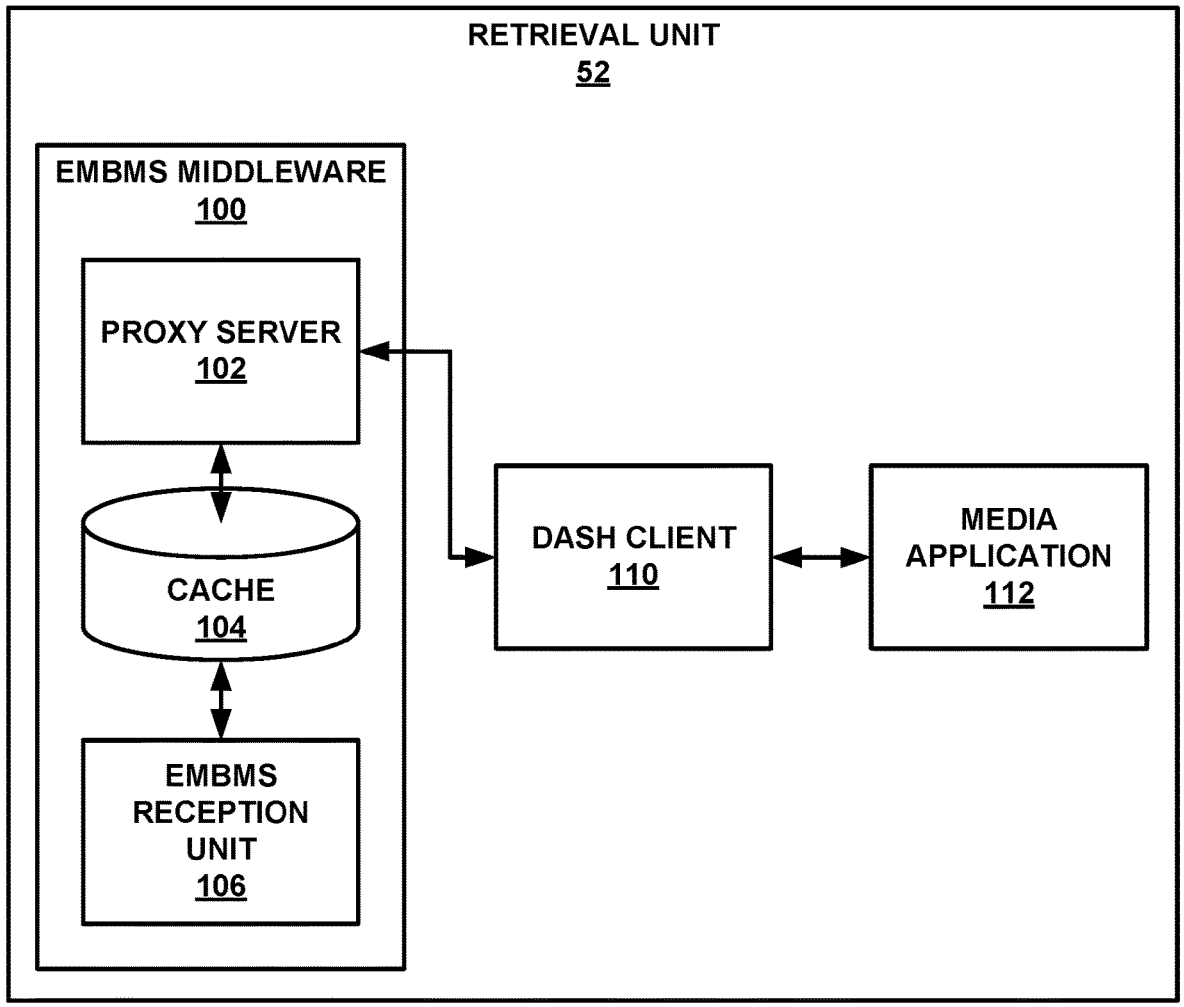
FIG. 2 is a block diagram illustrating an example set of components of a retrieval unit.

FIG. 2 is a block diagram illustrating an example set of components of retrieval unit 52 of FIG. 1 in greater detail. In this example, retrieval unit 52 includes eMBMS middleware unit 100, DASH client 110, and media application 112.

In this example, eMBMS middleware unit 100 further includes eMBMS reception unit 106, cache 104, and proxy server unit 102. In this example, eMBMS reception unit 106 is configured to receive data via eMBMS, e.g., according to File Delivery over Unidirectional Transport (FLUTE), described in T. Paila et al., "FLUTE—File Delivery over Unidirectional Transport," Network Working Group, RFC 6726, November 2012, available at tools.ietf.org/html/rfc6726. That is, eMBMS reception unit 106 may receive files via broadcast from, e.g., server device 60, which may act as a broadcast/multicast service center (BM-SC).

As eMBMS middleware unit 100 receives data for files, eMBMS middleware unit may store the received data in cache 104. Cache 104 may comprise a computer-readable storage medium, such as flash memory, a hard disk, RAM, or any other suitable storage medium.

Proxy server unit 102 may act as a server for DASH client 110. For example, proxy server unit 102 may provide a MPD file or other manifest file to DASH client 110. Proxy server unit 102 may advertise availability times for segments in the MPD file, as well as hyperlinks from which the segments can be retrieved. These hyperlinks may include a localhost address prefix corresponding to client device 40 (e.g., 127.0.0.1 for IPv4). In this manner, DASH client 110 may request segments from proxy server unit 102 using HTTP GET or partial GET requests. For example, for a segment available from link http://127.0.0.1/rep1/seg3, DASH client 110 may construct an HTTP GET request that includes a request for http://127.0.0.1/rep1/seg3, and submit the request to proxy server unit 102. Proxy server unit 102 may retrieve requested data from cache 104 and provide the data to DASH client 110 in response to such requests.

Figure 3:
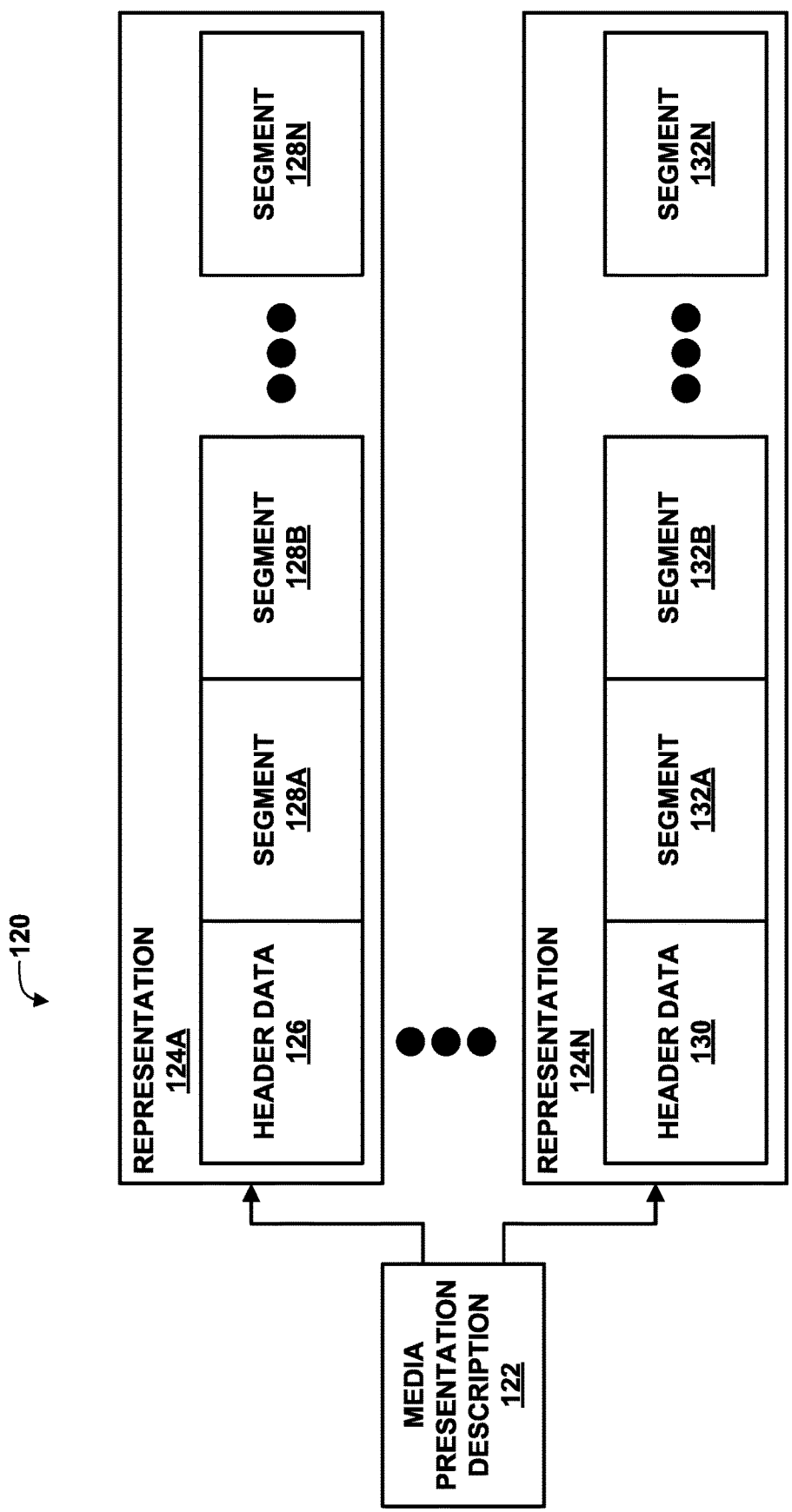
FIG. 3 is a conceptual diagram illustrating elements of example multimedia content.

FIG. 3 is a conceptual diagram illustrating elements of example multimedia content 120. Multimedia content 120 may correspond to multimedia content 64 (FIG. 1), or another multimedia content stored in storage medium 62. In the example of FIG. 3, multimedia content 120 includes media presentation description (MPD) 122 and a plurality of representations 124A-124N (representations 124). Representation 124A includes optional header data 126 and segments 128A-128N (segments 128), while representation 124N includes optional header data 130 and segments 132A-132N (segments 132). The letter N is used to designate the last movie fragment in each of representations 124 as a matter of convenience. In some examples, there may be different numbers of movie fragments between representations 124.

MPD 122 may comprise a data structure separate from representations 124. MPD 122 may correspond to manifest file 66 of FIG. 1. Likewise, representations 124 may correspond to representations 68 of FIG. 1. In general, MPD 122 may include data that generally describes characteristics of representations 124, such as coding and rendering characteristics, adaptation sets, a profile to which MPD 122 corresponds, text type information, camera angle information, rating information, trick mode information (e.g., information indicative of representations that include temporal sub-sequences), and/or information for retrieving remote periods (e.g., for targeted advertisement insertion into media content during playback).

Header data 126, when present, may describe characteristics of segments 128, e.g., temporal locations of random access points (RAPs, also referred to as stream access points (SAPs)), which of segments 128 includes random access points, byte offsets to random access points within segments 128, uniform resource locators (URLs) of segments 128, or other aspects of segments 128. Header data 130, when present, may describe similar characteristics for segments 132. Additionally or alternatively, such characteristics may be fully included within MPD 122.

Segments 128, 132 include one or more coded video samples, each of which may include frames or slices of video data. Each of the coded video samples of segments 128 may have similar characteristics, e.g., height, width, and bandwidth requirements. Such characteristics may be described by data of MPD 122, though such data is not illustrated in the example of FIG. 3. MPD 122 may include characteristics as described by the 3GPP Specification, with the addition of any or all of the signaled information described in this disclosure.

Each of segments 128, 132 may be associated with a unique uniform resource locator (URL). Thus, each of segments 128, 132 may be independently retrievable using a streaming network protocol, such as DASH. In this manner, a destination device, such as client device 40, may use an HTTP GET request to retrieve segments 128 or 132. In some examples, client device 40 may use HTTP partial GET requests to retrieve specific byte ranges of segments 128 or 132.

MPD 122 may include data representing a complexity of a media file, e.g., a maximum number of video blocks to be processed per second, a maximum number of pixels to be processed per second, a maximum number of decoder instances, and/or a maximum number of concurrent decoder instances. In some examples, the complexity may be represented by a video profile, tier, and/or level value. In some examples, the profile, tier, and/or level value may be signaled (additionally or alternatively) in a parameter set, such as a video parameter set (VPS), a sequence parameter set (SPS), or a picture parameter set (PPS). That is, content preparation device 20 of FIG. 1 may construct MPD 122 (or manifest file 66 of FIG. 1) to indicate values for profile, tier, and/or level information for a corresponding bitstream.

Figure 4:
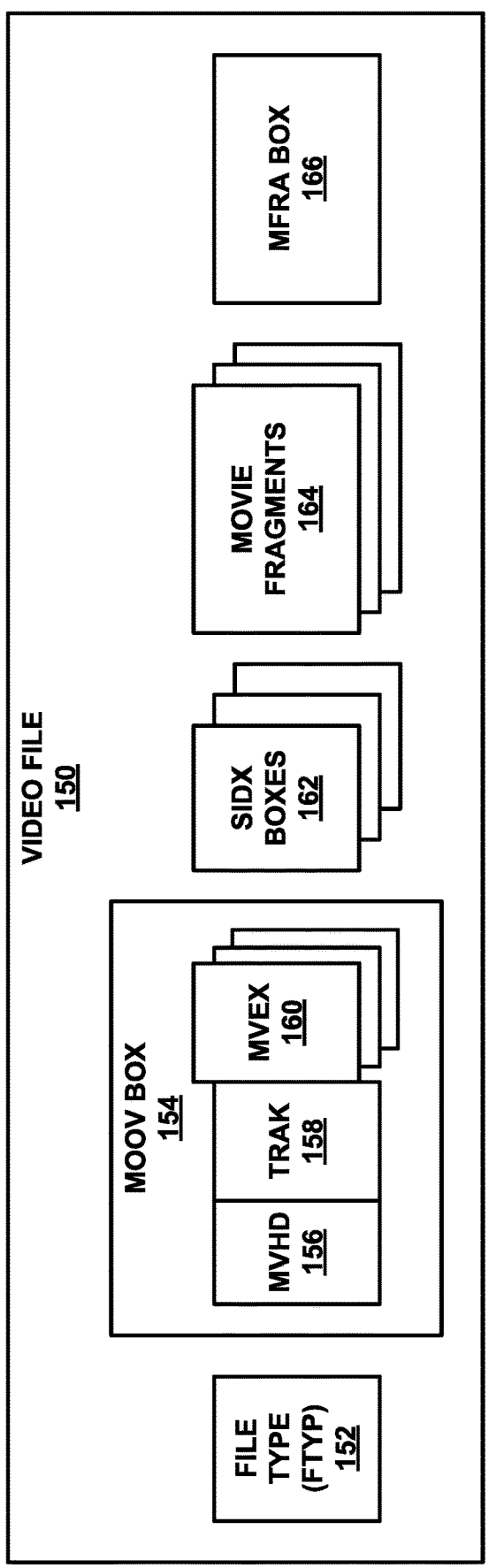
FIG. 4 is a block diagram illustrating elements of an example video file, which may correspond to a segment of a representation.

FIG. 4 is a block diagram illustrating elements of an example video file 150, which may correspond to a segment of a representation, such as one of segments 128, 132 of FIG. 3. Each of segments 128, 132 may include data that conforms substantially to the arrangement of data illustrated in the example of FIG. 4. Video file 150 may be said to encapsulate a segment. As described above, video files in accordance with the ISO base media file format and extensions thereof store data in a series of objects, referred to as "boxes." In the example of FIG. 4, video file 150 includes file type (FTYP) box 152, movie (MOOV) box 154, segment index (sidx) boxes 162, movie fragment (MOOF) boxes 164, and movie fragment random access (MFRA) box 166. Although FIG. 4 represents an example of a video file, it should be understood that other media files may include other types of media data (e.g., audio data, timed text data, or the like) that is structured similarly to the data of video file 150, in accordance with the ISO base media file format and its extensions.

File type box 152 generally describes a file type for video file 150. File type box 152 may include data that identifies a specification that describes a best use for video file 150. File type box 152 may alternatively be placed before MOOV box 154, movie fragment boxes 164, and/or MFRA box 166.

In some examples, a Segment, such as video file 150, may include an MPD update box (not shown) before file type box 152. The MPD update box may include information indicating that an MPD corresponding to a representation including video file 150 is to be updated, along with information for updating the MPD. For example, the MPD update box may provide a URI or URL for a resource to be used to update the MPD. As another example, the MPD update box may include data for updating the MPD. In some examples, the MPD update box may immediately follow a segment type (STYP) box (not shown) of video file 150, where the STYP box may define a segment type for video file 150.

MOOV box 154, in the example of FIG. 4, includes movie header (MVHD) box 156, track (TRAK) box 158, and one or more movie extends (MVEX) boxes 160. In general, MVHD box 156 may describe general characteristics of video file 150. For example, MVHD box 156 may include data that describes when video file 150 was originally created, when video file 150 was last modified, a timescale for video file 150, a duration of playback for video file 150, or other data that generally describes video file 150.

TRAK box 158 may include data for a track of video file 150. TRAK box 158 may include a track header (TKHD)

box that describes characteristics of the track corresponding to TRAK box 158. In some examples, TRAK box 158 may include coded video pictures, while in other examples, the coded video pictures of the track may be included in movie fragments 164, which may be referenced by data of TRAK box 158 and/or sidx boxes 162.

In some examples, video file 150 may include more than one track. Accordingly, MOOV box 154 may include a number of TRAK boxes equal to the number of tracks in video file 150. TRAK box 158 may describe characteristics of a corresponding track of video file 150. For example, TRAK box 158 may describe temporal and/or spatial information for the corresponding track. A TRAK box similar to TRAK box 158 of MOOV box 154 may describe characteristics of a parameter set track, when encapsulation unit 30 (FIG. 3) includes a parameter set track in a video file, such as video file 150. Encapsulation unit 30 may signal the presence of sequence level SEI messages in the parameter set track within the TRAK box describing the parameter set track.

MVEX boxes 160 may describe characteristics of corresponding movie fragments 164, e.g., to signal that video file 150 includes movie fragments 164, in addition to video data included within MOOV box 154, if any. In the context of streaming video data, coded video pictures may be included in movie fragments 164 rather than in MOOV box 154. Accordingly, all coded video samples may be included in movie fragments 164, rather than in MOOV box 154.

MOOV box 154 may include a number of MVEX boxes 160 equal to the number of movie fragments 164 in video file 150. Each of MVEX boxes 160 may describe characteristics of a corresponding one of movie fragments 164. For example, each MVEX box may include a movie extends header box (MEHD) box that describes a temporal duration for the corresponding one of movie fragments 164.

As noted above, encapsulation unit 30 may store a sequence data set in a video sample that does not include actual coded video data. A video sample may generally correspond to an access unit, which is a representation of a coded picture at a specific time instance. In the context of AVC, the coded picture include one or more VCL NAL units, which contain the information to construct all the pixels of the access unit and other associated non-VCL NAL units, such as SEI messages. Accordingly, encapsulation unit 30 may include a sequence data set, which may include sequence level SEI messages, in one of movie fragments 164. Encapsulation unit 30 may further signal the presence of a sequence data set and/or sequence level SEI messages as being present in one of movie fragments 164 within the one of MVEX boxes 160 corresponding to the one of movie fragments 164.

SIDX boxes 162 are optional elements of video file 150. That is, video files conforming to the 3GPP file format, or other such file formats, do not necessarily include SIDX boxes 162. In accordance with the example of the 3GPP file format, a SIDX box may be used to identify a sub-segment of a segment (e.g., a segment contained within video file 150). The 3GPP file format defines a sub-segment as "a self-contained set of one or more consecutive movie fragment boxes with corresponding Media Data box(es) and a Media Data Box containing data referenced by a Movie Fragment Box must follow that Movie Fragment box and precede the next Movie Fragment box containing information about the same track." The 3GPP file format also indicates that a SIDX box "contains a sequence of references to subsegments of the (sub)segment documented by the box. The referenced subsegments are contiguous in presentation time. Similarly, the bytes referred to by a Segment Index box are always contiguous within the segment. The referenced size gives the count of the number of bytes in the material referenced."

SIDX boxes 162 generally provide information representative of one or more sub-segments of a segment included in video file 150. For instance, such information may include playback times at which sub-segments begin and/or end, byte offsets for the sub-segments, whether the sub-segments include (e.g., start with) a stream access point (SAP), a type for the SAP (e.g., whether the SAP is an instantaneous decoder refresh (IDR) picture, a clean random access (CRA) picture, a broken link access (BLA) picture, or the like), a position of the SAP (in terms of playback time and/or byte offset) in the sub-segment, and the like.

Movie fragments 164 may include one or more coded video pictures. In some examples, movie fragments 164 may include one or more groups of pictures (GOPs), each of which may include a number of coded video pictures, e.g., frames or pictures. In addition, as described above, movie fragments 164 may include sequence data sets in some examples. Each of movie fragments 164 may include a movie fragment header box (MFHD, not shown in FIG. 4). The MFHD box may describe characteristics of the corresponding movie fragment, such as a sequence number for the movie fragment. Movie fragments 164 may be included in order of sequence number in video file 150.

MFRA box 166 may describe random access points within movie fragments 164 of video file 150. This may assist with performing trick modes, such as performing seeks to particular temporal locations (i.e., playback times) within a segment encapsulated by video file 150. MFRA box 166 is generally optional and need not be included in video files, in some examples. Likewise, a client device, such as client device 40, does not necessarily need to reference MFRA box 166 to correctly decode and display video data of video file 150. MFRA box 166 may include a number of track fragment random access (TFRA) boxes (not shown) equal to the number of tracks of video file 150, or in some examples, equal to the number of media tracks (e.g., non-hint tracks) of video file 150.

In some examples, movie fragments 164 may include one or more stream access points (SAPs), such as IDR pictures. Likewise, MFRA box 166 may provide indications of locations within video file 150 of the SAPs. Accordingly, a temporal sub-sequence of video file 150 may be formed from SAPs of video file 150. The temporal sub-sequence may also include other pictures, such as P-frames and/or B-frames that depend from SAPs. Frames and/or slices of the temporal sub-sequence may be arranged within the segments such that frames/slices of the temporal sub-sequence that depend on other frames/slices of the sub-sequence can be properly decoded. For example, in the hierarchical arrangement of data, data used for prediction for other data may also be included in the temporal sub-sequence.

Figure 5:
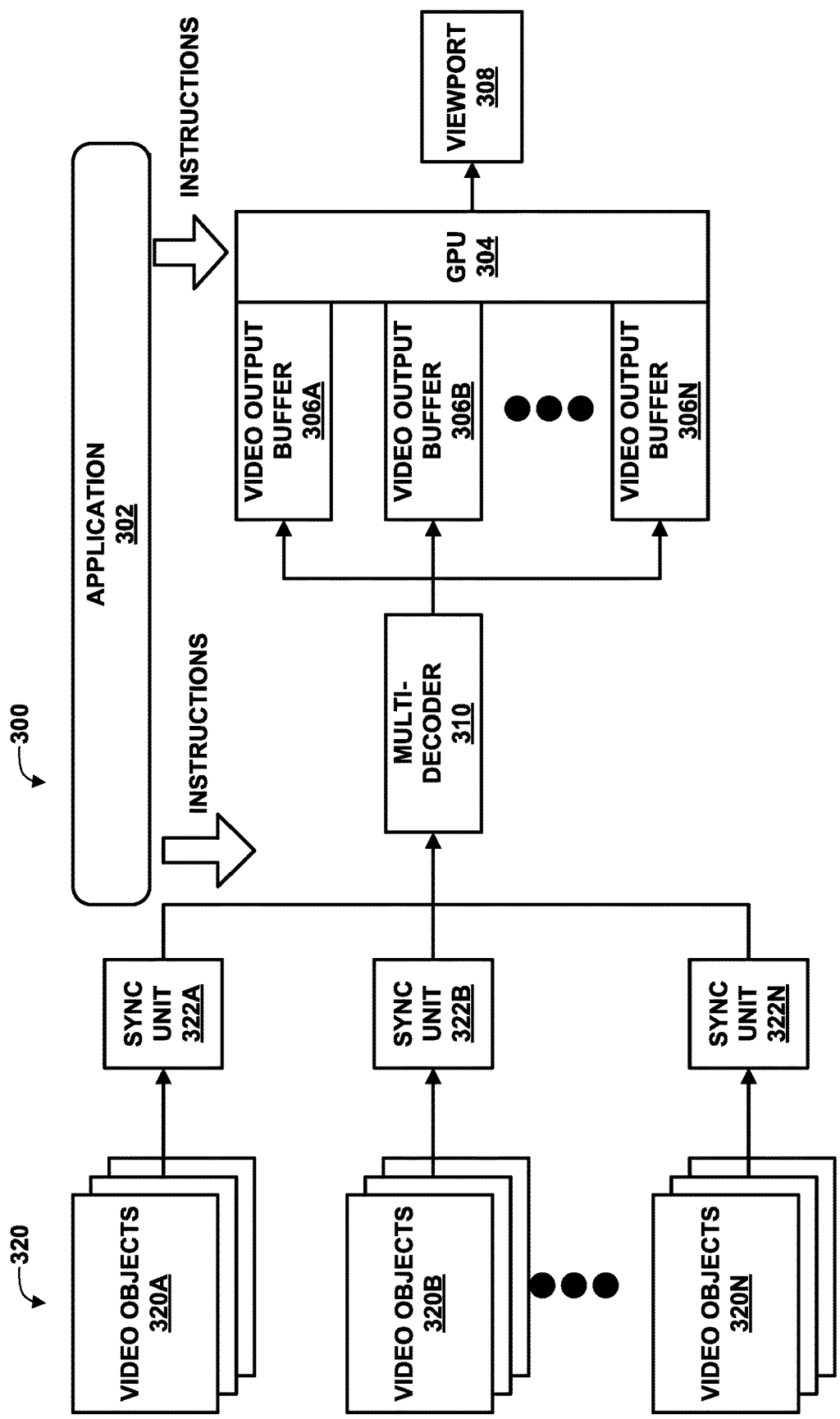
FIG. 5 is a conceptual diagram illustrating an example system for decoding streamed media data.
Figure 6:
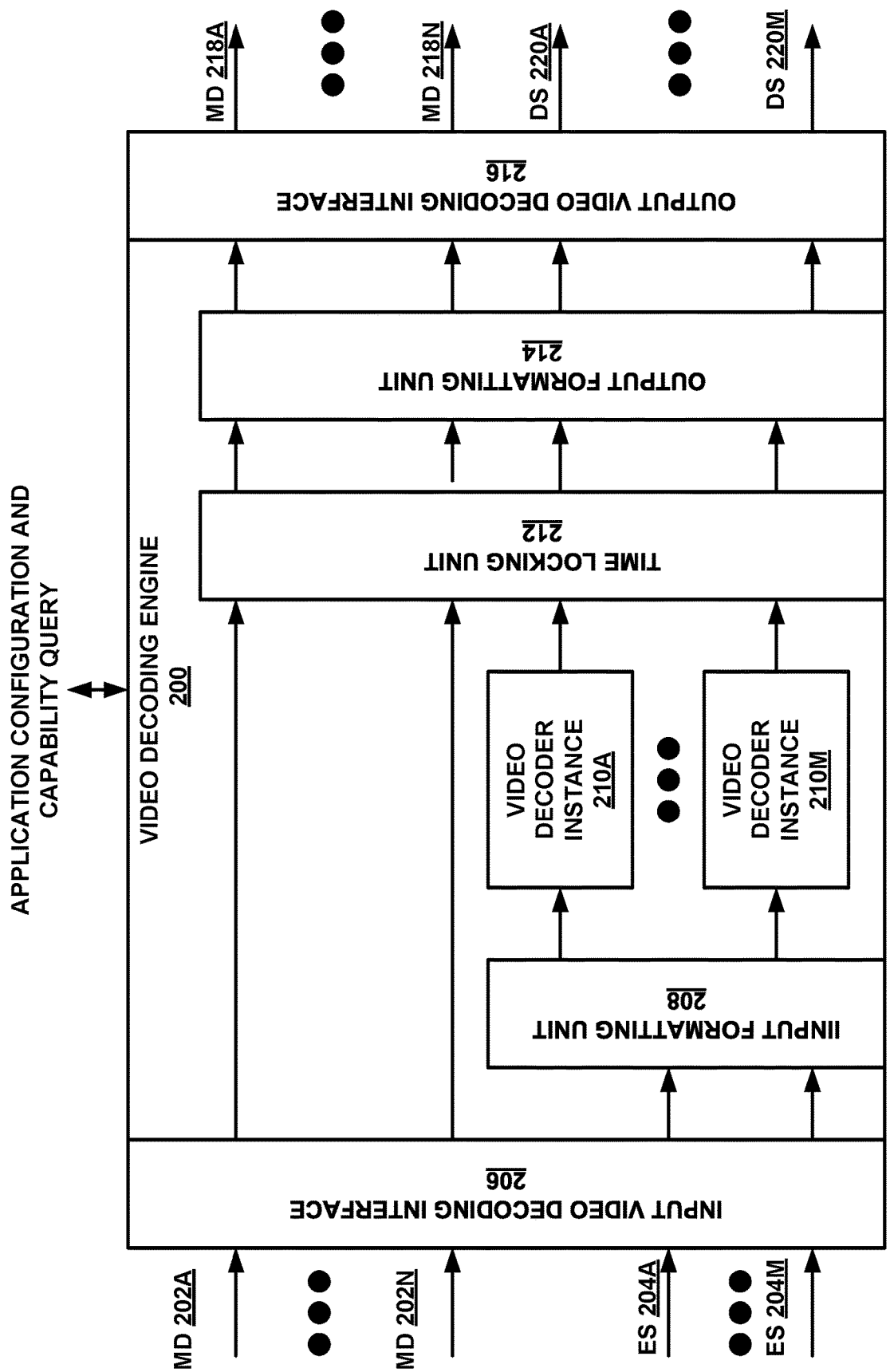
FIG. 6 is a block diagram illustrating an example decoding engine and associated interfaces.

FIG. 5 is a conceptual diagram illustrating an example system 300 for decoding streamed media data. System 300 includes application 302, multi-decoder 310 (which may be an example of an MVD), graphics processing unit (GPU) 304, video output buffers 306A-306N (video output buffers 306), and viewport 308. In some example, video output buffers 306 may be a single buffer as depicted in FIG. 6.

In general, system 300 dynamically uses pose information of a user and possibly other interactive data to combine a scene for proper rendering. In particular, system 300 may use pose information to select, from among various video objects 320A-320N (video objects 320), respective video streams to be retrieved. In particular, system 300 retrieves synchronization units 322A-322N (sync units 322) from respective video objects 320 according to, e.g., the pose information. For instance, system 300 may retrieve a relatively high-quality video stream for a portion of viewport 308 at which a user is looking directly, and a relatively low-quality video stream for a portion of viewport 308 that the user cannot see or is at the periphery of the user's perspective. Each of video objects 320 may have different qualities (e.g., different resolutions) available for retrieval. For example, higher resolution decoding may be applied in the field-of-view, whereas background information may be decoded in lower quality.

In general, sync units 322 each include a respective set of pictures that is to be rendered or assembled at the same (or substantially the same) time. Thus, by retrieving respective sync units 322, system 300 can ensure that the retrieved sync units are decoded, rendered, and/or assembled in a synchronous manner.

System 300 may be configured to dynamically use available streaming/network access bitrate as well as available decoding resources of multi-decoder 310 to maximize user experience. Hence, system 300 may dynamically use the available network and hardware decoding resources to adapt to the network conditions, as well as to user feedback. One issue is that application 302 may provide a well-defined interface in order to use the hardware decoding resources.

Video objects 320 available in different qualities or bitrates may be decoded by a single decoder instance. Video objects 320 may share resources dynamically, depending on the situation. Multi-decoder 310 may output each of video objects 320 to an individual, respective one of video output buffers 306 that can be referenced by application 302, for example, to support GPU-based modification for rendering. System 300 may synchronize the output data accordingly, for example, by providing sync units 322 to multi-decoder 310. The techniques of this disclosure may provide a well-defined multi-decoder interface/API (application programming interface) and a proper ability to reference the output of each of the decoders by a follow-up rendering unit (e.g., part of GPU 304 or separate from GPU 304). By doing so, the available hardware resources can be used efficiently. The decoder interface may be codec-agnostic and may even use different codecs within a decoding session, e.g. AVC, HEVC, and/or AV1.

In this manner, system 300 of FIG. 5 represents an example of a device for decoding media data including memory configured to store media data, and one or more processors implemented in circuitry and communicatively coupled to the memory, the one or more processors being configured to determine whether two or more decoder instances are intended to be synchronized, and based on the two or more decoder instances being intended to be synchronized, control the two or more decoder instances so as to enable rendering of decoded data from each of the two or more decoder instances at a same presentation time.

Immersive media presentations typically require the rendering of a large amount of 2D and 3D assets, which are composed together to offer an immersive experience to a user. Many of these media assets may require hardware-accelerated decoding of at least some of their components for rendering.

As discussed in N18868, "Considerations on Working Draft on video decoding interfaces for immersive media", October 2019, Geneva, CH, MVDs provide access to the decoding hardware through application programming interfaces (APIs) like OpenMAX IL or Android's MediaCodec APIs. These APIs allow an application to create and run multiple decoder instances, even in cases where there is only a single hardware decoder.

However, these APIs may lack some capabilities for the handling of immersive media. For example, the APIs may lack the ability to discover the aggregate processing capability of the MVDs. For example, logical grouping of multiple samples from different streams for simultaneous decoding is currently not possible. In some examples, the aggregation may be inferred from an nTimestamp parameter in a buffer header, but there is no information to the MVD component to keep the delay skew to a minimum when decoding these related samples. Additionally, fine granular control of the scheduling of the different decoder instances may not be possible.

According to the techniques of this disclosure, abstract extensions to the decoder APIs provide better support for immersive media and address the issues discussed above. These abstract extensions may be mapped to OpenMAX IL and MediaCodec, for example.

Discovery of the capability of an MVD is now discussed. The load on the media decoding hardware varies over time, depending on how many decoder instances are instantiated at that time and the characteristics of the content that is being decoded. Therefore, it may be important for applications, such as immersive media rendering engines, to be able to discover the instantaneous capabilities and resource availability of the MVD, such as multi-decoder 310.

The following functions may be used by the application (e.g., application 302) to query (and determine) the instantaneous aggregate capabilities of an MVD for a specific codec component. For example, in the OpenMAX Integration Layer, components represent individual blocks of functionality. Components can be sources, sinks, codecs, filters, splitters, mixers, or any other data operator. Depending on the implementation, a component could possibly represent a piece of hardware, a software codec, another processor, or a combination thereof. This capability information can be used for access control to the MVD and/or for adapting the decoding process based on resource availability.

One function may be as follows:
object queryCurrentAggregateCapabilities (string componentName, int flags) The componentName provides the name of the media component of the MVD for which the query applies. The name "All" may be used to indicate that the query is not for a particular component, but rather is for all components of the MVD.

The following capability flags may be queried separately or in a single function call:

CAP_INSTANCES: this flag indicates the maximum number of decoder instances that can be instantiated at this instant for the provided decoder component.

CAP_BUFFER_MEMORY: this flag indicates the maximum available buffer size that can be allocated at this instant on the MVD for buffer exchange with components of the MVD. Note that this value is independent from any media components and applies globally to the MVD. The value may be expressed in bytes.

CAP_BITRATE: This flag queries the maximum coded bitrate in bits per second that the queried component is able to process at this instant.

CAP_MAX_SAMPLES_SECOND: This flag queries the maximum number of samples per second that the queried component is able to process at this instant.

CAP_MAX_PERFORMANCE_POINT: This flag is used to query the maximum performance point of a bitstream that can be decoded by the indicated component in a new instance of that decoder component. A performance point has the following parameters:

PICTURE_RATE: the picture rate of the maximum performance point in pictures per second.

HEIGHT: the height in luma samples of the maximum performance point

WIDTH: the width in luma samples of the maximum performance point

BITDEPTH: the bit depth of the luma samples of the maximum performance point

It should be noted that each parameter of the max performance point does not necessarily represent the maximum in that dimension. The combination of all dimensions may constitute the maximum performance point.

Grouping across decoder instances is now discussed. The content of immersive media assets may require decoding of multiple components, which may be made available simultaneously to the presentation engine (e.g., GPU 304 of FIG. 5) for reconstruction and rendering. Decoder instances may be grouped together to inform the MVD that the decoded samples are to be provided simultaneously at the MVD output, for example for later synchronization and joint rendering.

FIG. 6 is a block diagram illustrating an example decoding engine and associated interfaces. Video decoding engine 200 (which may be an example of an MVD) may receive metadata streams (MD) 202A-202N and elementary streams (ES) 204A-204M at input video decoding interface 206. Input formatting unit 208 may format elementary streams 204A-204M and output formatted elementary streams to video decoder instances 210A-210M. Video decoder instances 210A-210M may decode the formatted elementary streams. Time locking unit 212 may lock together elementary streams based, for example, on the group_id, which may be contained in metadata streams 202A-202N. Output formatting unit 214 may format the decoded streams and output video decoding interface may output metadata streams (MD) 218A-218N and decoded sequences (DS) 220A-220M, for example, for rendering.

Figure 7:
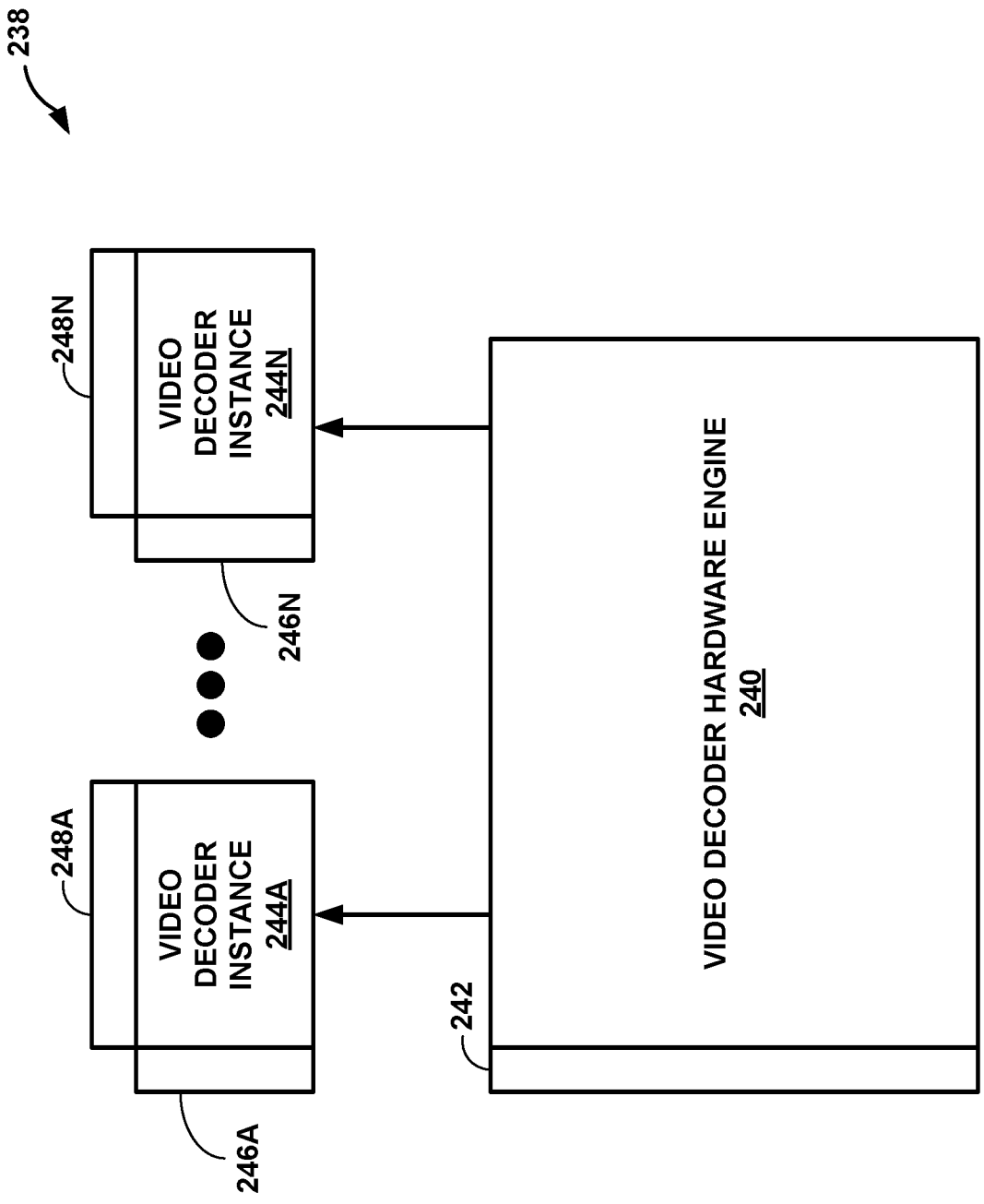
FIG. 7 is a block diagram illustrating an example video decoder hardware engine and example video decoder instances.

FIG. 7 is a block diagram of illustrating an example video decoder hardware engine and example video decoder instances. MVD 238 may include video decoder hardware engine 240. Video decoder hardware engine 240 may create and control video decoder instances 244A-244N. Video decoder hardware engine 240 may include engine control interface 242. Engine control interface 242 may be an interface by which application 302 may control video decoder hardware engine 240. Each of video decoder instances 244A-244N may include an input video interface 246A-246N, respectively. Separate video streams to be decoded may be received by video decoder instances 244A-244N through input video interface 246A-246N, respectively. Video decoder instances 244A-244N may output decoded video through output video interfaces 248A-248N, respectively.

Figure 8:
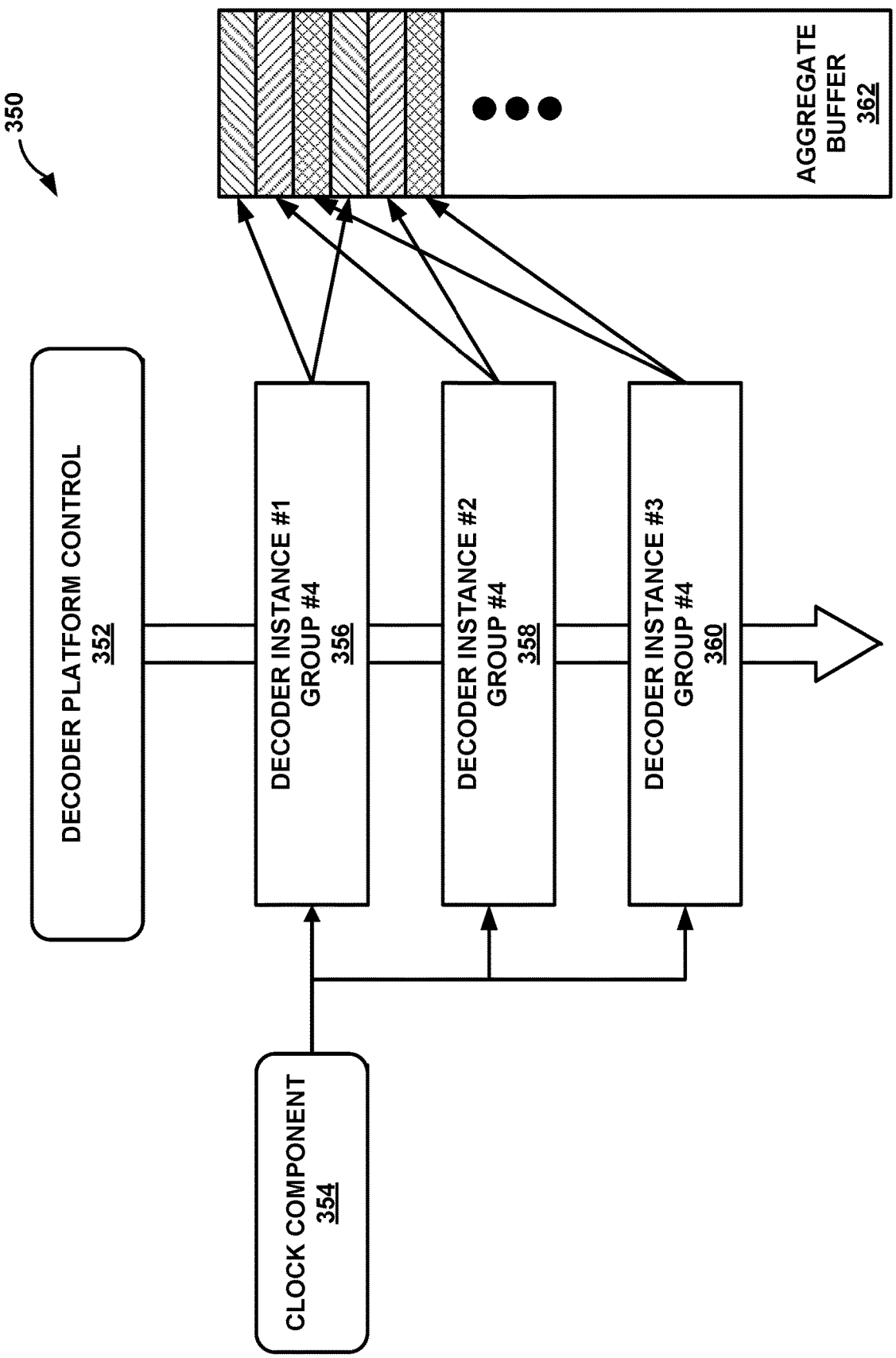
FIG. 8 is a conceptual diagram illustrating a multiple video decoder (MVD) having an aggregate output buffer in accordance with the techniques of this disclosure.

FIG. 8 is a conceptual diagram illustrating an example MVD having an aggregate output buffer in accordance with the techniques of this disclosure. MVD 350 includes decoder platform control 352, clock component 354, decoder instance 356, decoder instance 358, decoder instance 360, and aggregate buffer 362. All decoder instances (e.g., decoder instance 356, decoder instance 358, and decoder instance 360 all of group #4) of the same group may be connected to the same clock component (e.g., clock component 354) for synchronization. All decoder instances of the same group may use the same timestamp offset and unit of measurement, so that the same timestamp value (e.g., the same timestamp offset and unit of measurement) indicates that the samples across the decoder instances of the same group have the same presentation time. A presentation time is a time at which a decoded stream may be rendered. For example, each decoder instance (e.g., decoder instances 356, 358, and 360) of a same group of MVD 350 may be connected to the same clock (e.g., clock component 354) and use the same timestamp offset and unit. The output of each decoder instance of the same group may be aggregated in aggregate buffer 362 and may be rendered at the same presentation time.

When creating a new decoder instance, application 302 (of FIG. 5) may assign the new decoder instance to an already existing group of instances by providing the group_id of that group. For example, application 302 may create a new decoder instance of group 4, to join decoder instances 356, 358, and 360 and may provide the group_id of 4 to the new decoder instance. A group_id value of 0 instructs the MVD to assign and return a new group_id for that decoder instance. In other words, if application 302 assigns a new decoder instance with a group_id of 0, that decoder instance need not have a same presentation time as decoder instances 356, 358, and 360 and decoder platform control 352 may assign the new decoder instance a new group_id, such as 5.

Decoder instances of the same group (e.g., group 4) may use a single output buffer, such as aggregate buffer 362. In that case, aggregate buffer 362 may be provided by the MVD and used by each component to fill the buffer with decoded samples of the same timestamp. Application 302 may indicate the type of interleaving that is requested in aggregate buffer 362. For example, a decoded mesh or point cloud stream may have interleaved geometry, normals, and color attributes in aggregate buffer 362. The indication may include format, offset, and stride for each sample from each decoder component as is discussed later in this disclosure. Interleaving is depicted in aggregate buffer 362 of FIG. 6 with output from decoder instance 356 shown with diagonal striping in one direction, output from decoder instance 358 shown with diagonal striping in another direction, and output from decoder instance 360 shown with crosshatching.

Functions are now discussed. The function to create a new decoder instance may be modified to support the signaling of the group (e.g., group_id) to which the new decoder instance may belong (e.g., group #4). The configuration function may be modified to signal the aggregate output buffer parameters, discussed in more detail below. For example, application 302 may signal aggregate output buffer parameters.

In OpenMAX IL functions include OMX_GetHandle and OMX_SetConfig. In the following, the functions are defined as abstract functions, which can be mapped onto OpenMAX, MediaCodec or any other similar API.

object GetInstance (string component_name, int group_id=−1)

object SetConfig (int instance_id, int parameter, object config_data)

The result of a successful call to the GetInstance function call may contain the identifier of the instance of the decoder and the group_id that is assigned or created for this instance of the decoder, if one was requested. The default (e.g., when group_id equals 0) is that the decoder instance does not belong to any already established group, but MVD 350 creates a new group.

The SetConfig function may be called with a new parameter "CONFIG_OUTPUT_BUFFER", in which case the SetConfig function provides the format of aggregate buffer 362.

The format of aggregate buffer 362 may include the following parameters:

- sample_format which indicates the format of each sample, which can be a scalar, a 2D vector, a 3D vector, or a 4D vector.
- sample_type which indicates the type (e.g., geometry, color attribute, normal, etc.) of each component of the sample.
- sample_stride which indicates the number of bytes between 2 consecutive samples of this output of a decoder instance.
- line_stride which indicates the number of bytes between the first byte of one line and the first byte of the following line of this output of a decoder instance.
- buffer_offset which indicates the offset into aggregate buffer 362, from which the output frame of a decoder instance should be written.

Scheduling and output control are now discussed. Immersive applications may require finer granular control of the decoding process than non-immersive applications. For example, application 302 might want immediate access to all sub-frames, notification about specific metadata availability, filtering of the output of a decoder component, and/or a limit on the time jitter for consecutive executions of the decoder instance.

These functionalities may be achieved through the definition of decoder instance configuration parameters that can be set as part of the decoder instance configuration. For example, application 302 may determine decoder instance configuration parameters for a new decoder instance when defining the new decoder instance.

For example, the GetParameter and SetParameter functions may be extended with the following configuration parameters:

- PARAM_SUBFRAME_OUTPUT. This parameter may be used to indicate if the output of subframes is required, desired, or not allowed. If the output of subframes is not allowed, only complete decoded frames will be passed to aggregate buffer 362.
- PARAM_METADATA_CALLBACK. This parameter may be used to set a callback function for a specific metadata type. The list of supported metadata types is codec dependent and may be defined for each codec independently.
- PARAM_OUTPUT_CROP. This parameter may be used to indicate that only part of the decoded frame is desired at the output (e.g., the renderer or display device). The decoder instance may use this information to intelligently reduce its decoding processing by discarding units that do not fall in the cropped output region whenever possible.
- PARAM_MAX_OFFTIME_JITTER. This parameter may be used to signal the maximum amount of time in microseconds between consecutive executions of the decoder instance. This parameter may be relevant whenever the underlying hardware component is shared among multiple decoder instance, which requires context switching between the different decoder instances.

Example usage for immersive applications is now discussed. For example, this section of the disclosure describes how these decoder interface extensions can be leveraged for immersive media applications in the example of Video-based Point Cloud compressed media (V-PCC). Additional use cases may include rendering a stream of a sign language translator with a stream of a speaker whose voice is being translated by the sign language translator in a synchronized manner or rendering multiple camera angles at a sporting event in a synchronized manner.

Figure 9:
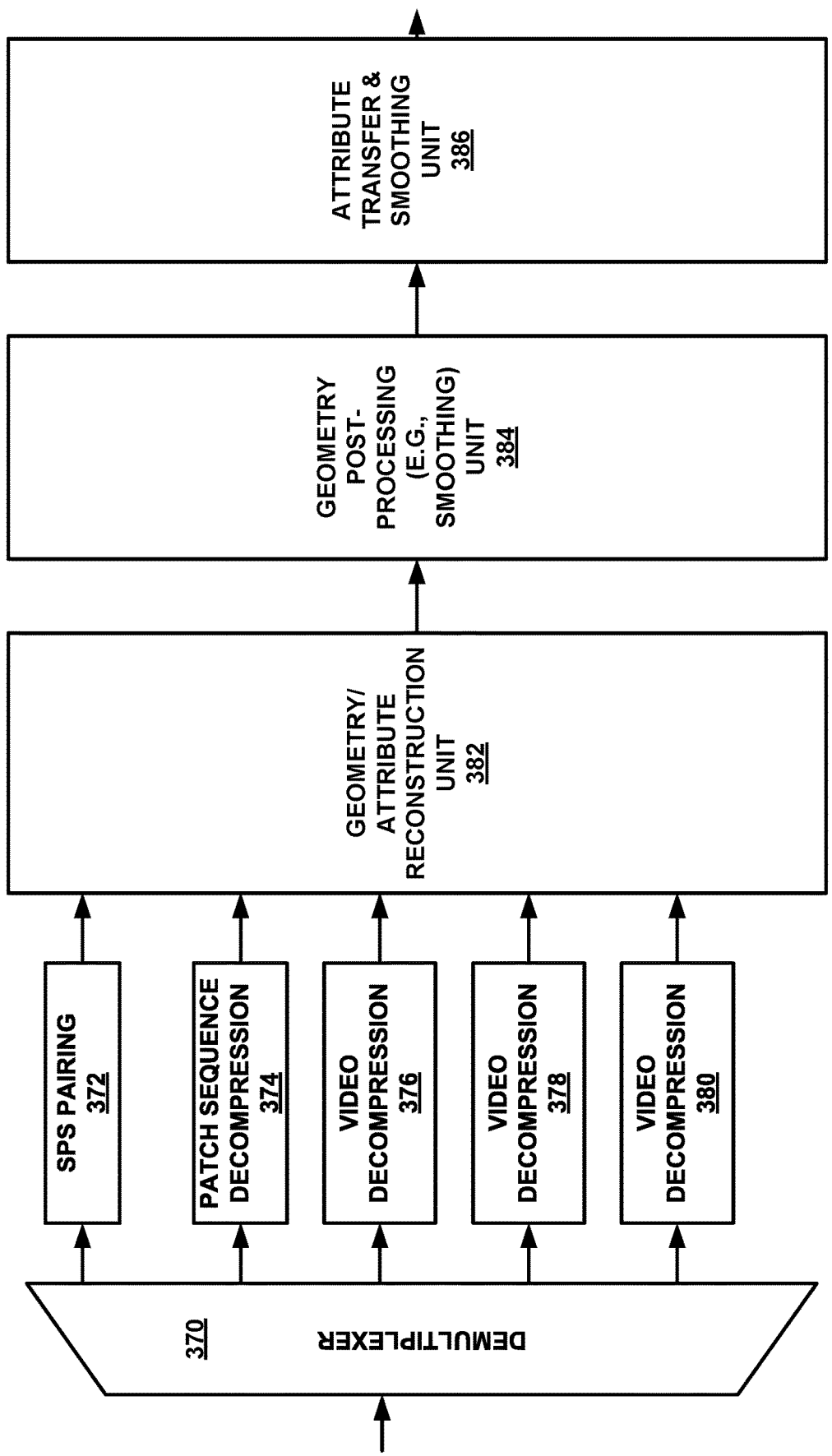
FIG. 9 is a conceptual diagram illustrating an example Video-based Point Cloud (V-PCC) decoder in accordance with the techniques of this disclosure.

FIG. 9 is a block diagram illustrating an example V-PCC decoder. A V-PCC stream consists of several sub-streams that include encoded geometry, each attribute of the point cloud, an occupancy map and a metadata stream for patch information. For example, demultiplexer 370 may demultiplex the V-PCC stream. SPS pairing unit 372 may pair various attributes with sequence parameters. Path sequence decompression unit 374 may decompress path sequences. Video decompression unit 376, video decompression unit 378, and video decompression unit 380 may decompress different video data. Geometry/attribute reconstruction unit 382 may reconstruct geometry and attributes. For example, geometry/attribute reconstruction unit 312 determine coordinates of points in a point cloud and reconstruct attributes associated with the points. Geometry post-processing unit 384 may smooth the locations of the points. Attribute transfer and smoothing unit 386 may transfer the attributes to the appropriate points in the point cloud and smooth the attributes and output the reconstructed point cloud for rendering. Depending on the number of attributes of a point cloud, decoding a V-PCC asset may require running between 3 and 16 decoders simultaneously, 1 for geometry, 1 for the occupancy map, and one for each attribute (such as color, normals, etc.).

A V-PCC decoder may tightly synchronize the output of the different video decoders with frame accuracy to attempt to ensure correct point cloud reconstruction. The application (e.g., application 302 of FIG. 5) may first query the instantaneous capabilities of the MVD to determine if all components of the V-PCC stream can be decoded. The application might, for instance, decide to drop some attributes if the available decoding capacity is not enough to decode all the attributes. Application 302 may start creating decoder instances using the GetHandle function and assign all decoder instances to the same group_id. This may inform the MVD that tight synchronization of the output of these decoder instances may be required.

To facilitate the 3D point cloud reconstruction efficiently on the GPU (e.g., GPU 304 of FIG. 5), the application (e.g., application 302 of FIG. 5) may request that the different decoder instances in the group share a common buffer (e.g., aggregate buffer 362 of FIG. 8) that may be hosted in GPU memory and written to once per frame. In some examples, rather than interleaving samples in the common buffer, samples may not be interleaved as, in some examples, sample interleaving may not be useful prior to the reconstruction of the point cloud.

The application (e.g., application 302) may dynamically receive scene and pose information and determine that not all parts of the point cloud are visible at a certain point of time. The application may use metadata information to map the visible 3D portions of the point cloud into a set of visible patches and the corresponding 2D regions. This information may be passed on to the decoding instances (e.g., decoder instances 356, 358, and 360 of FIG. 8) to request cropping of the output to the indicated 2D region. The decoder instances may further use this information to reduce the decoding processing by limiting the decoding to the visible 2D regions.

Figure 10:
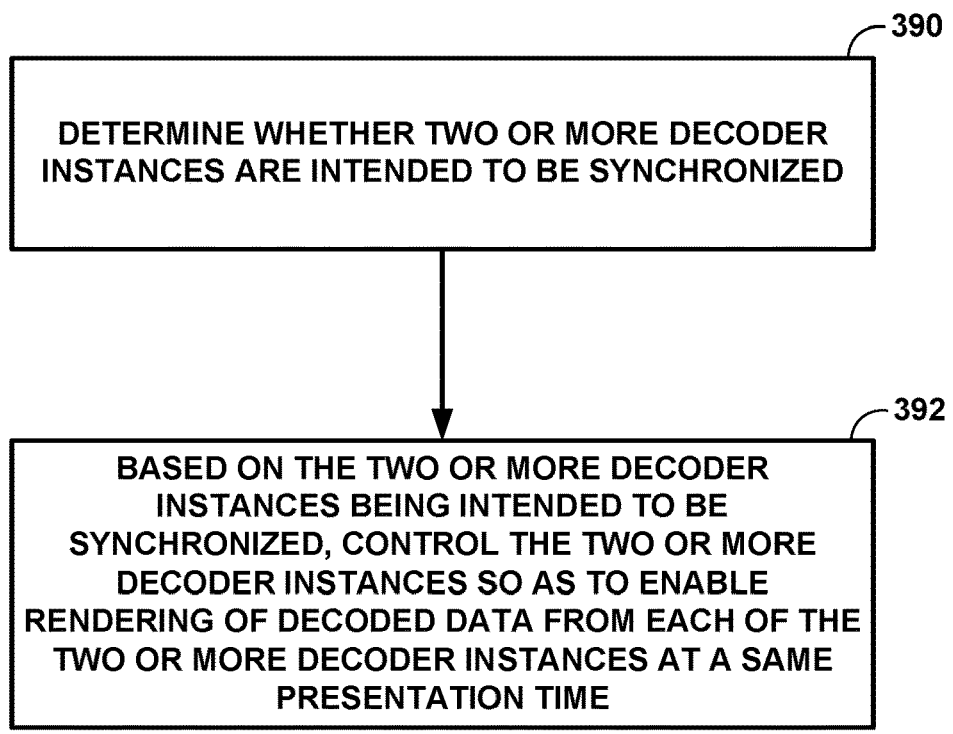
FIG. 10 is a flowchart illustrating example techniques for grouping decoder instances according to this disclosure.

FIG. 10 is a flowchart illustrating example techniques for grouping decoder instances according to this disclosure. A device may determine whether two or more decoder instances are intended to be synchronized (390). For example, decoder platform control 352 of MVD 350 may determine whether a group identifier (ID) of each of the two or more decoder instances is identical. Having an identical group ID may be indicative of an intention that the two or more decoder instances are to be synchronized. For example, application 302 may assign two or more decoder instances intended to be synchronized with an identical group ID.

Based on the two or more decoder instances being intended to be synchronized, control the two or more decoder instances so as to enable rendering of decoded data from each of the two or more decoder instances at a same presentation time (392). For example, MVD 350 may assign a same timestamp offset and unit to each of the two or more decoder instances. A same timestamp value may be indicative of samples across each of the two or more decoder instances having the same presentation time. MVD 350 may couple each of the two or more decoder instances to a same clock.

Furthermore, in some examples, MVD 350 may buffer output of the two or more decoder instances in aggregate buffer 362 of FIG. 8. Aggregate buffer 362 may be configured to interleave decoded data output from each of the two or more decoder instances. In some examples, MVD 350 may determine parameters for aggregate buffer 362, for example, by reading instructions from application 302. In some examples, the parameters comprise one or more of an indication of the format of a sample, an indication of the type of each component of the sample, an indication of a number of bytes between two consecutive samples of an output, an indication of a number of bytes between a first byte of one line and a first byte of a following line of the output, or an indication of an offset from which an output frame should be written. In some examples, MVD 350 may configure aggregate buffer 362 based on the parameters.

In some examples, the group ID is a first group ID and MVD 350 may receive, from an application, a request to create a new decoder instance. The request may include a second group ID. MVD 350 may determine whether the second group ID is identical to the first group ID. MVD 350 may create the new decoder instance. MVD 350 may, based on the second group ID being identical to the first group ID, control the new decoder instance so as to enable rendering of decoded data from the new decoder instance at the same presentation time as each of the two or more decoder instances. For example, MVD 350 may assign a same timestamp offset and unit to the new decoder instance as to each of the two or more decoder instances, couple the new decoder instance to the same clock as each of the two or more decoder instances, and/or buffer the output of the new decoder instance in the same aggregate buffer as the two or more decoder instances.

In some examples, the group ID is a first group ID and MVD 350 may receive, from an application, a request to create a new decoder instance. The request may include a second group ID. MVD 350 may determine whether the second group ID is equal to 0. Based on the second group ID being 0, MVD 350 may create the new decoder instance and assign the new decoder instance to a new group ID.

In some examples, MVD 350 may determine parameters for a new decoder instance. For example, MVD may read instructions from application 302 to determine the parameters for the new decoder instance. The parameters may include on or more of: an indication of whether output of subframes is required, desired, or not allowed; an indication a specific metadata type for which set a callback function; an indication of whether only part of a decoded frame is desired at an output; or an indication of a maximum amount of time between consecutive executions of the decoder instance. In some examples, MVD 350 may create the new decoder instance based upon the parameters.

In some examples, MVD 350 may determine current aggregate capabilities of a multiple video decoder. In some examples, MVD 350 may determine current aggregate capabilities of a multiple video decoder in response to receiving a query from application 302. In some examples, MVD 350 may send, to application 302, an indication of the current aggregate capabilities of the multiple video decoder.

In some examples, the current aggregate capabilities include one of more of: an indication of a maximum number of decoder instances that can be instantiated for a provided decoder component at a time of creation of the indication of the maximum number decoder instances that can be instantiated; an indication of a maximum available buffer size that can be allocated on an MVD for buffer exchange with components of an MVD at a time of creation of the indication of the maximum available buffer size that can be allocated; an indication of a maximum coded bitrate that a queried component is able to process at a time of creation of the indication of the maximum coded bitrate that the queried component is able to process; an indication of a maximum number of samples per unit of time that the queried component is able to process at a time of creation of the indication of the maximum number of samples per unit of time that the queried component is able to process; or an indication of a maximum performance point of a bitstream that can be decoded by an indicated component in a new instance of a decoder component.

In some example, the indication of the maximum performance point of the bitstream that can be decoded by the indicated component includes, a picture rate of the maximum performance point in pictures per unit of time, a height in luma samples of the maximum performance point, a width in luma samples of the maximum performance point, and a bit depth of luma samples of the maximum performance point.

In some examples, client device 40 includes a display device configured to display the point cloud.

In this manner, applications may be able to query MVD for current capabilities, multiple samples from different streams may be grouped for simultaneous decoding by an MVD, and applications may be able to exert fine granular control of the scheduling of the different decoder instances of an MVD.

This disclosure includes the following examples.

Clause 1. A method of decoding media data, the method comprising: determining, by a client device including a plurality of video decoders, capabilities of a plurality of components of the client device; one or more of controlling access to the plurality of video decoders or adapting a decoding process based on the capabilities of the plurality of components, by the client device; and decoding, by the client device, the media data based on the one or more of controlling access or adapting the decoding process.

Clause 2. The method of clause 1, wherein the determined capabilities comprise one or more of a maximum number of decoder instances that can be instantiated at a time for a first component of the plurality of components, a maximum buffer size that can be allocated at the time for buffer exchange with the plurality of components, a maximum coded bitrate that the first component is able to process at the time, a maximum number of samples per unit of time that the first component is able to process at the time, or a maximum performance point of a bitstream that can be decoded by the first component in a new decoder instance of the first component.

Clause 3. The method of clause 2, wherein the maximum performance point comprises one or more of a picture rate of the maximum performance point in pictures per a unit of time, a height in luma samples of the maximum performance point, a width in luma samples of the maximum performance point, or a bit depth of luma samples of the maximum performance point.

Clause 4. The method of clause 3, wherein the maximum performance point comprises the picture rate of the maximum performance point in pictures per the unit of time, the height in luma samples of the maximum performance point, the width in luma samples of the maximum performance point, and the bit depth of luma samples of the maximum performance point.

Clause 5. The method of any combination of clauses 1-4, further comprising: determining an identifier of a decoder instance and a group id of the decoder instance.

Clause 6. The method of any combination of clauses 1-5, further comprising: determining a format of an output buffer.

Clause 7. The method of clause 6, wherein the format of the output buffer comprises one or more of a format of each sample, a type of each component of each sample, a number of bytes between two consecutive samples of an output, a number of bytes between a first byte of one line of the output and a first byte of a following line of the output, or an offset into the output buffer starting from which output frame should be written.

Clause 8. The method of clause 7, wherein the format of each sample comprises one of scalar, a 2D vector, a 3D vector or a 4D vector.

Clause 9. The method of any combination of clauses 1-8, further comprising: determining a configuration of a decoder instance.

Clause 10. The method of clause 9, wherein the configuration comprises one of more of: indicating of whether an output of subframes is required, desired or not allowed; setting a callback function for a type of metadata; indicating that only part of a decoded frame is desired at an output; or signaling a maximum amount of time per a unit of time between consecutive executions of the decoder instance.

Clause 11. The method of clause 10, wherein a list of supported metadata types is codec dependent and defined for each codec independently.

Clause 12. A client device for decoding media data, the client device comprising: a memory configured to store the media data; and one or more processors implemented in circuitry and configured to: execute a plurality of video decoders; and Clause 13. The client device of clause 12, further comprising a display configured to display decoded media data.

Clause 14. The client device of any combination of clauses 12-13, wherein the device comprises one or more of a camera, a computer, a mobile device, a broadcast receiver device, or a set-top box.

Clause 15. The client device of any combination of clauses 12-14, further comprising the plurality of video decoders.

Clause 16. The client device of any combination of clauses 12-15, further comprising a video encoder.

Clause 17. An apparatus for decoding media data, the apparatus comprising one or more means for performing any combination of clauses 1-11.

Clause 18. A computer-readable storage medium having stored thereon instructions that, when executed, cause a processor to: execute a plurality of video decoders; and perform any combination of clauses 1-11.

In one or more examples, the functions described may be implemented in hardware, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code, and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transitory media, but are instead directed to non-transitory, tangible storage media. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various examples have been described. These and other examples are within the scope of the following claims.

What is claimed is:

1. A method of decoding media data, the method comprising:
   determining, by a client device, that two or more decoder instances are intended to be synchronized, wherein determining that the two or more decoder instances are intended to be synchronized comprises determining that a group identifier (ID) of each of the two or more decoder instances is identical; and
   based on the two or more decoder instances being intended to be synchronized, controlling the two or more decoder instances so as to enable rendering of decoded data from each of the two or more decoder instances at a same presentation time.

2. The method of claim 1, wherein the group ID is a first group ID, the method further comprising:
   receiving, from an application, a request to create a new decoder instance, the request comprising a second group ID;
   determining that the second group ID is identical to the first group ID;
   creating the new decoder instance; and
   based on the second group ID being identical to the first group ID, controlling the new decoder instance so as to enable rendering of decoded data from the new decoder instance at the same presentation time as each of the two or more decoder instances.

3. The method of claim 1, wherein the group ID is a first group ID, the method further comprising:
   receiving, from an application, a request to create a new decoder instance, the request comprising a second group ID;
   determining that the second group ID is equal to 0, wherein the second group ID being equal to 0 is indicative of the new decoder instance not being intended to being synchronized with the two or more decoder instances; and
   based on the second group ID being equal to 0, creating the new decoder instance and assigning the new decoder instance a new group ID.

4. The method of claim 1, further comprising:
   assigning a same timestamp offset and unit of measurement to each of the two or more decoder instances, wherein the same timestamp offset and unit of measurement is indicative of samples across each of the two or more decoder instances having the same presentation time.

5. The method of claim 4, wherein each of the two or more decoder instances is coupled to a same clock.

6. The method of claim 1, further comprising:
   buffering output of the two or more decoder instances in an aggregate buffer, wherein the aggregate buffer is configured to interleave decoded data output from each of the two or more decoder instances.

7. The method of claim 6, further comprising:
   determining parameters for the aggregate buffer, wherein the parameters comprise one or more of:
      an indication of a format of a sample;
      an indication of a type of each component of the sample;
      an indication of a number of bytes between two consecutive samples of an output of a decoder instance;
      an indication of a number of bytes between a first byte of one line and a first byte of a following line of the output of the decoder instance; or
      an indication of an offset from which an output frame of a decoder instance should be written.

8. The method of claim 1, further comprising:
   determining parameters for a new decoder instance, wherein the parameters comprise one or more of:
      an indication of whether output of subframes is required, desired, or not allowed;
      an indication a specific metadata type for which set a callback function;
      an indication of whether only part of a decoded frame is desired at an output; or
      an indication of a maximum amount of time between consecutive executions of the new decoder instance.

9. The method of claim 8, further comprising:
   creating the new decoder instance based upon the parameters.

10. The method of claim 1, further comprising:
    determining current aggregate capabilities of a multiple video decoder.

11. The method of claim 10, wherein the determining the current aggregate capabilities of the multiple video decoder is in response to receiving a query from an application; the method further comprising:
    sending, to the application, an indication of the current aggregate capabilities of the multiple video decoder.

12. The method of claim 10, wherein the current aggregate capabilities comprise one of more of:
    an indication of a maximum number of decoder instances that can be instantiated for a provided decoder component at a time of creation of the indication of the maximum number decoder instances that can be instantiated;
    an indication of a maximum available buffer size that can be allocated on a multiple video decoder (MVD) for buffer exchange with components of an MVD at a time of creation of the indication of the maximum available buffer size that can be allocated;
    an indication of a maximum coded bitrate that a queried component is able to process at a time of creation of the indication of the maximum coded bitrate that the queried component is able to process;
    an indication of a maximum number of samples per unit of time that the queried component is able to process at a time of creation of the indication of the maximum number of samples per unit of time that the queried component is able to process; or
    an indication of a maximum performance point of a bitstream that can be decoded by an indicated component in a new instance of a decoder component.

13. The method of claim 12, wherein the indication of the maximum performance point of the bitstream that can be decoded by the indicated component comprises:
    a picture rate of the maximum performance point in pictures per unit of time;
    a height in luma samples of the maximum performance point;
    a width in luma samples of the maximum performance point; and
    a bit depth of luma samples of the maximum performance point.

14. A device for decoding media data, the device comprising:
    memory configured to store the media data; and one or more processors implemented in circuitry and communicatively coupled to the memory, the one or more processors being configured to:
  determine that two or more decoder instances are intended to be synchronized, wherein the one or more processors are configured to determine that the two or more decoder instances are intended to be synchronized by determining that a group identifier (ID) of each of the two or more decoder instances is identical; and
  based on the two or more decoder instances being intended to be synchronized, control the two or more decoder instances so as to enable rendering of decoded data from each of the two or more decoder instances at a same presentation time.

15. The device of claim 14, wherein the group ID is a first group ID, the one or more processors are further configured to:
  receive, from an application, a request to create a new decoder instance, the request comprising a second group ID;
  determine that the second group ID is identical to the first group ID;
  create the new decoder instance; and
  based on the second group ID being identical to the first group ID, control the new decoder instance so as to enable rendering of decoded data from the new decoder instance at the same presentation time as each of the two or more decoder instances.

16. The device of claim 14, wherein the group ID is a first group ID, and wherein the one or more processors are further configured to:
  receive, from an application, a request to create a new decoder instance, the request comprising a second group ID;
  determine that the second group ID is equal to 0, wherein the second group ID being equal to 0 is indicative of the new decoder instance not being intended to being synchronized with the two or more decoder instances; and
  based on the second group ID being equal to 0, create the new decoder instance and assign the new decoder instance a new group ID.

17. The device of claim 14, wherein the one or more processors are further configured to:
  assign a same timestamp offset and unit of measurement to each of the two or more decoder instances, wherein the same timestamp offset and unit of measurement is indicative of samples across each of the two or more decoder instances having the same presentation time.

18. The device of claim 17, further comprising a clock communicatively coupled to each of the two or more decoder instances.

19. The device of claim 14, further comprising:
  an aggregate buffer communicatively coupled to the one or more processors, the aggregate buffer being configured to interleave decoded data output from each of the two or more decoder instances.

20. The device of claim 19, wherein the one or more processors are further configured to:
  determine parameters for the aggregate buffer, wherein the parameters comprise one or more of:
    an indication of a format of a sample;
    an indication of a type of each component of the sample;
    an indication of a number of bytes between two consecutive samples of an output of a decoder instance;
    an indication of a number of bytes between a first byte of one line and a first byte of a following line of the output of the decoder instance; or
    an indication of an offset from which an output frame of a decoder instance should be written.

21. The device of claim 20, wherein the one or more processors are further configured to configure the aggregate buffer based on the parameters.

22. The device of claim 14, wherein the one or more processors are further configured to:
  determine parameters for a new decoder instance, wherein the parameters comprise one or more of:
    an indication of whether output of subframes is required, desired, or not allowed;
    an indication a specific metadata type for which set a callback function;
    an indication of whether only part of a decoded frame is desired at an output; or
    an indication of a maximum amount of time between consecutive executions of the new decoder instance.

23. The device of claim 22, wherein the one or more processors are further configured to:
  create the new decoder instance based upon the parameters.

24. The device of claim 14, wherein the one or more processors are further configured to:
  determine current aggregate capabilities of a multiple video decoder.

25. The device of claim 24, wherein the one or more processors determine the current aggregate capabilities of the multiple video decoder in response to receiving a query from an application, and the wherein the one or more processors are further configured to:
  send, to the application, an indication of the current aggregate capabilities of the multiple video decoder.

26. The device of claim 24, wherein the current aggregate capabilities comprise one of more of:
  an indication of a maximum number of decoder instances that can be instantiated for a provided decoder component at a time of creation of the indication of the maximum number decoder instances that can be instantiated;
  an indication of a maximum available buffer size that can be allocated on a multiple video decoder (MVD) for buffer exchange with components of an MVD at a time of creation of the indication of the maximum available buffer size that can be allocated;
  an indication of a maximum coded bitrate that a queried component is able to process at a time of creation of the indication of the maximum coded bitrate that the queried component is able to process;
  an indication of a maximum number of samples per unit of time that the queried component is able to process at a time of creation of the indication of the maximum number of samples per unit of time that the queried component is able to process; or
  an indication of a maximum performance point of a bitstream that can be decoded by an indicated component in a new instance of a decoder component.

27. The device of claim 26, wherein the indication of the maximum performance point of the bitstream that can be decoded by the indicated component comprises:
  a picture rate of the maximum performance point in pictures per unit of time;
  a height in luma samples of the maximum performance point;

a width in luma samples of the maximum performance point; and a bit depth of luma samples of the maximum performance point.

28. The device of claim 14, further comprising a display device communicatively coupled to the one or more processors, the display device being configured to display a point cloud.

29. A non-transitory computer-readable storage medium storing instructions, which, when executed by one or more processors, cause the one or more processors to:

determine that two or more decoder instances are intended to be synchronized, wherein to determine that the two or more decoder instances are intended to be synchronized, the instructions cause the one or more processors to determine that a group identifier (ID) of each of the two or more decoder instances is identical; and based on the two or more decoder instances being intended to be synchronized, control the two or more decoder instances so as to enable rendering of decoded data from each of the two or more decoder instances at a same presentation time.

30. A device for decoding media data, the device comprising:

means for determining that two or more decoder instances are intended to be synchronized, wherein the means for determining that the two or more decoder instances are intended to be synchronized determines that a group identifier (ID) of each of the two or more decoder instances is identical; and means for controlling the two or more decoder instances so as to enable rendering of decoded data from each of the two or more decoder instances at a same presentation time based on the two or more decoder instances being intended to be synchronized.

* * * * *